(12) United States Patent
Song et al.

(10) Patent No.: US 12,255,212 B2
(45) Date of Patent: Mar. 18, 2025

(54) IMAGE SENSOR

(71) Applicant: SAMSUNG ELECTRONICS CO., LTD., Suwon-si (KR)

(72) Inventors: Taeyoung Song, Hwaseong-si (KR); Eun Sub Shim, Hwaseong-si (KR); Changhyun Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 355 days.

(21) Appl. No.: 17/845,547

(22) Filed: Jun. 21, 2022

(65) Prior Publication Data

US 2023/0154945 A1 May 18, 2023

(30) Foreign Application Priority Data

Nov. 18, 2021 (KR) .................. 10-2021-0159834

(51) Int. Cl.
 *H01L 27/146* (2006.01)
(52) U.S. Cl.
 CPC .. *H01L 27/14605* (2013.01); *H01L 27/14612* (2013.01); *H01L 27/14621* (2013.01)
(58) Field of Classification Search
 CPC ......... H01L 27/14605; H01L 27/14612; H01L 27/14621
 See application file for complete search history.

(56) References Cited

U.S. PATENT DOCUMENTS

| | | | |
|---|---|---|---|
| 9,438,836 B2 | 9/2016 | Tashiro et al. | |
| 10,554,920 B2 | 2/2020 | Okumura | |
| 10,586,819 B2 | 3/2020 | Hirata | |
| 10,616,509 B2 | 4/2020 | Seki et al. | |
| 2009/0316026 A1 | 12/2009 | Okumura | |
| 2020/0228761 A1 | 7/2020 | Ramaswami et al. | |
| 2020/0267342 A1 | 8/2020 | Matsumoto | |
| 2022/0124264 A1* | 4/2022 | Jang .................. | H04N 25/702 |

FOREIGN PATENT DOCUMENTS

| | | |
|---|---|---|
| JP | 6136103 B2 | 5/2017 |
| JP | 2020-78056 A | 5/2020 |
| KR | 10-1639385 B1 | 7/2016 |

\* cited by examiner

*Primary Examiner* — Douglas M Menz
(74) *Attorney, Agent, or Firm* — Sughrue Mion, PLLC

(57) ABSTRACT

An image sensor is provided. The image sensor includes: a pixel array of pixels arranged in a row and column directions. A first pixel provided in a first row of the pixel array includes a first sub-pixel connected with a first metal line, a second sub-pixel connected with a second metal line, a third sub-pixel connected with a third metal line, and a fourth sub-pixel connected with a fourth metal line. When a read-out operation is performed on the first pixel, signals applied to the first through fourth metal lines are sequentially enabled. Based on the applied signals, at least a part of charges accumulated in the first through fourth sub-pixels is diffused to a first floating diffusion node. The first sub-pixel and the third sub-pixel are adjacent in the column direction, and the first sub-pixel and the second sub-pixel are adjacent in the row direction.

20 Claims, 16 Drawing Sheets

FIG. 7

| PIX1 | | PIX2 | | PIX3 | | PIX4 | |
|---|---|---|---|---|---|---|---|
| SP1 1 | SP2 2 | SP1 3 | SP2 1 | SP1 2 | SP2 3 | SP1 3 | SP2 2 |
| 3 SP3 | 4 SP4 | 2 SP3 | 4 SP4 | 4 SP3 | 1 SP4 | 1 SP3 | 4 SP4 |
| SP1 2 | SP2 1 | SP1 3 | SP2 2 | SP1 3 | SP2 2 | SP1 4 | SP2 3 |
| 3 SP3 | 4 SP4 | 4 SP3 | 1 SP4 | 1 SP3 | 4 SP4 | 2 SP3 | 1 SP4 |
| PIX5 | | PIX6 | | PIX7 | | PIX8 | |

IMAGE SENSOR

CROSS-REFERENCE TO RELATED APPLICATIONS

This application claims priority to Korean Patent Application No. 10-2021-0159834 filed on Nov. 18, 2021, in the Korean Intellectual Property Office, the disclosure of which is incorporated by reference herein in its entirety.

BACKGROUND

The present disclosure relates to an image sensor including a pixel including a plurality of photoelectric conversion elements.

An image sensor may be mounted in various types of electronic devices. For example, a smartphone, a tablet personal computer (PC), a laptop PC, or a wearable device may include the image sensor.

The image sensor obtains image information about an external object by converting a light reflected from the external object into an electrical signal. The electronic device including the image sensor may display an image in a display panel by using the obtained image information.

The image sensor may include a plurality of pixels, each of which includes a plurality of photoelectric conversion elements. In a pixel, a pixel value corresponding to one of the photoelectric conversion elements first detected according to a driving signal tends to be higher than pixel values corresponding to the remaining pixel signals. This is due to a random telegraph signal (RTS) noise occurring due to electron trap/de-trap of a source follower transistor.

SUMMARY

One or more example embodiments provide an image sensor including a pixel including a plurality of photoelectric conversion elements.

According to an example embodiment, an image sensor includes: a pixel array comprising pixels arranged in a row direction and a column direction; and a plurality of metal lines, the plurality of metal lines comprising a first metal line, a second metal line, a third metal line and a fourth metal line. A first pixel provided in a first row of the pixel array comprises a first sub-pixel connected with the first metal line, a second sub-pixel connected with the second metal line, a third sub-pixel connected with the third metal line, and a fourth sub-pixel connected with the fourth metal line. When a read-out operation is performed on the first pixel, signals applied to the first metal line, the second metal line, the third metal line and the fourth metal line are sequentially enabled. Based on the signals applied to the first metal line, the second metal line, the third metal line and the fourth metal line, at least a part of charges accumulated in the first sub-pixel, the second sub-pixel, the third sub-pixel and the fourth sub-pixel is diffused to a first floating diffusion node. The first sub-pixel and the third sub-pixel are adjacent in the column direction. The first sub-pixel and the second sub-pixel are adjacent in the row direction.

According to an example embodiment, an image sensor includes: a pixel array comprising pixels arranged in a row direction and a column direction; and a plurality of metal lines, the plurality of metal lines comprising a first metal line, a second metal line, a third metal line and a fourth metal line. A first pixel provided in a first row of the pixel array comprises a first sub-pixel connected with the first metal line, a second sub-pixel connected with the second metal line, a third sub-pixel connected with the third metal line, and a fourth sub-pixel connected with the fourth metal line. A second pixel provided in the first row comprises a fifth sub-pixel connected with the fourth metal line, a sixth sub-pixel connected with the third metal line, a seventh sub-pixel connected with the first metal line, and an eighth sub-pixel connected with the second metal line. When a read-out operation is performed on the first row, signals applied to the first metal line, the second metal line, the third metal line and the fourth metal line are sequentially enabled. Based on the signals applied to the first metal line, the second metal line, the third metal line and the fourth metal line, at least a part of charges accumulated in the first sub-pixel, the second sub-pixel, the third sub-pixel and the fourth sub-pixel is diffused to a first floating diffusion node, and at least a part of charges accumulated in the fifth to eighth sub-pixels is diffused to a second floating diffusion node. The first sub-pixel, the second sub-pixel, the fifth sub-pixel, and the sixth sub-pixel are sequentially provided in the row direction. The third sub-pixel, the fourth sub-pixel, the seventh sub-pixel, and the eighth sub-pixel are sequentially provided in the row direction. The first sub-pixel and the third sub-pixel are adjacent in the column direction.

According to an example embodiment, an image sensor includes: a pixel array comprising pixels arranged in a row direction and a column direction; and a plurality of metal lines, the plurality of metal lines comprising a first metal line, a second metal line, a third metal line, a fourth metal line, a fifth metal line, a sixth metal line, a seventh metal line, an eighth metal line and a ninth metal line. A first pixel provided in a first row of the pixel array comprises a first sub-pixel connected with the first metal line, a second sub-pixel connected with the second metal line, a third sub-pixel connected with the third metal line, a fourth sub-pixel connected with the fourth metal line, a fifth sub-pixel connected with the fifth metal line, a sixth sub-pixel connected with the sixth metal line, a seventh sub-pixel connected with the seventh metal line, an eighth sub-pixel connected with the eighth metal line, and a ninth sub-pixel connected with the ninth metal line. A second pixel provided in the first row comprises a tenth sub-pixel, an eleventh sub-pixel connected with the first metal line and a twelfth sub-pixel connected with the second metal line. When a read-out operation is performed on the first pixel, signals applied to the first metal line, the second metal line, the third metal line, the fourth metal line, the fifth metal line, the sixth metal line, the seventh metal line, the eighth metal line and the ninth metal line are sequentially enabled. Based on the signals applied to the first metal line, the second metal line, the third metal line, the fourth metal line, the fifth metal line, the sixth metal line, the seventh metal line, the eighth metal line and the ninth metal line, at least a part of charges accumulated in the first sub-pixel, the second sub-pixel, the third sub-pixel, the fourth sub-pixel, the fifth sub-pixel, the sixth sub-pixel, the seventh sub-pixel, the eighth sub-pixel and the ninth sub-pixel is diffused to a first floating diffusion node. The first sub-pixel, the second sub-pixel, the third sub-pixel, the tenth sub-pixel, the eleventh sub-pixel and the twelfth sub-pixel are sequentially provided in the row direction.

According to an example embodiment, an image sensor includes: a pixel array comprising pixels arranged in a row direction and a column direction; and a plurality of metal lines, the plurality of metal lines comprising a first metal line, a second metal line, a third metal line and a fourth metal line. A first pixel provided in a first row of the pixel array comprises a first sub-pixel connected with the first metal line, a second sub-pixel connected with the second metal line, a third sub-pixel connected with the third metal line, and a fourth sub-pixel connected with the fourth metal line, the first sub-pixel, the second sub-pixel, the third sub-pixel and the fourth sub-pixel are provided in a first 2×2 matrix. A second pixel provided in the first row comprises a fifth sub-pixel connected with the first metal line, a sixth sub-pixel connected with the second metal line, a seventh sub-pixel connected with the third metal line, and an eighth sub-pixel connected with the fourth metal line, the fifth sub-pixel, the sixth sub-pixel, the seventh sub-pixel and the eighth sub-pixel forming a second 2×2 matrix. When a read-out operation is performed on the first pixel, based on signals applied to the first metal line, the second metal line, the third metal line and the fourth metal line, at least a part of charges accumulated in the first sub-pixel, the second sub-pixel, the third sub-pixel and the fourth sub-pixel is sequentially diffused to a first floating diffusion node. A first location of the first sub-pixel in the first 2×2 matrix is different from a second location of the fifth sub-pixel in the second 2×2 matrix.

According to an embodiment, an image sensor includes: a first pixel comprising N first sub-pixels sharing a first floating diffusion node; a second pixel comprising N second sub-pixels sharing a second floating diffusion node, wherein the second pixel is adjacent the first pixel in a row direction; and N selection lines extending along the row direction over the first pixel and the second pixel. The N selection lines comprises a first selection line, a second selection line, a third selection line and a fourth selection lin. The first selection line is connected to a first sub-pixel which is in a first row and a first column among the N first sub-pixels, and a second sub-pixel which is in a first row and a second column among the N second sub-pixels. The second selection line is connected to a third sub-pixel which is in the first row and a second column among the N first sub-pixels, and a fourth sub-pixel which is in the first row and a first column among the N second sub-pixels. The third selection line is connected to a fifth sub-pixel which is in a second row and the first column among the N first sub-pixels, and a sixth sub-pixel which is in a second row and the first column among the N second sub-pixels. The fourth selection line is connected to a seventh sub-pixel which is in the second row and the second column among the N first sub-pixels, and an eighth sub-pixel which is in the second row and the second column among the N second sub-pixels.

BRIEF DESCRIPTION OF THE FIGURES

The above and other aspects will become more apparent from the following description of example embodiments with reference to the accompanying drawings.

FIG. 7 illustrates an order in which sub-pixels are read out based on a wire structure of FIG. 6, according to an example embodiment.

DETAILED DESCRIPTION

Hereinafter, example embodiments will be described in more detail with reference to accompanying drawings. Similar components/elements will be marked by similar reference signs/numerals in drawings, and thus, additional description will be omitted to avoid redundancy.

Figure 1:
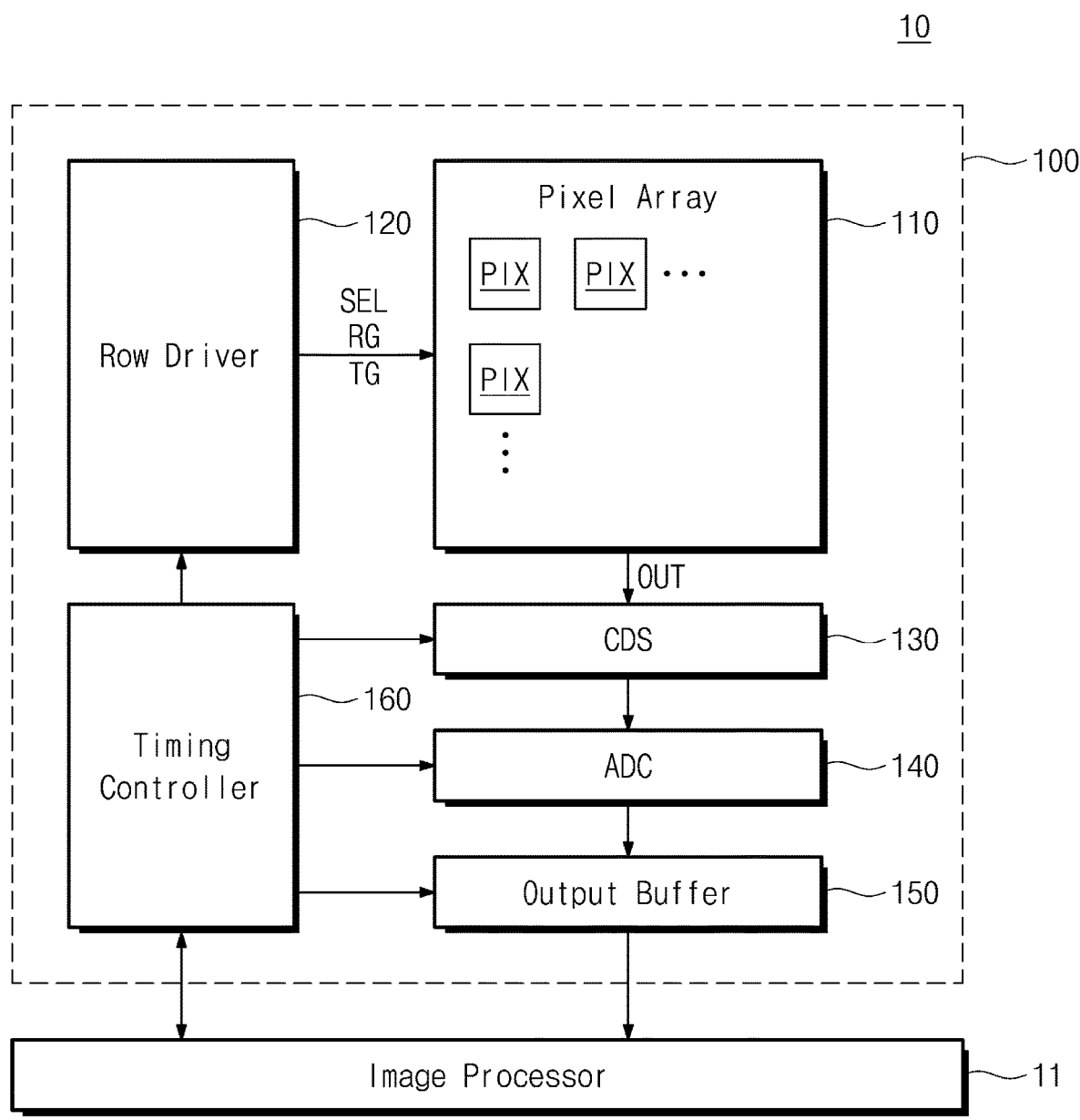
FIG. 1 is a block diagram of an electronic device according to an example embodiment.

FIG. 1 is a block diagram of an electronic device 10 according to an example embodiment. Referring to FIG. 1, the electronic device 10 may include an image sensor 100 and an image processor 11. The image sensor 100 may operate according to a control command provided from the image processor 11. The image sensor 100 may convert a light from an object into an electrical signal and may transfer the electrical signal to the image processor 11 as image data.

The image sensor 100 may include a pixel array 110, a row driver 120, a correlated double sampler (CDS) 130, an analog-to-digital converter (ADC) 140, an output buffer 150, and a timing controller 160. The pixel array 110 may include a plurality of pixels PIX arranged in a row direction and a column direction. Each of the pixels PIX may include a photoelectric element (e.g., a photodiode, a phototransistor, a photogate, or a pinned photodiode) that receives a light and generates charges based on the received light.

Each of the plurality of pixels PIX may further include a circuit for generating an electrical signal from charges generated by a photodiode(s). The circuit included in each of the plurality of pixels PIX and an operation of the circuit will be described later in detail.

The pixel array 110 may be controlled by sensor driving signals, which are transmitted from the row driver 120, such as a selection signal SEL, a reset signal RG, and a transfer signal TG. A plurality of electrical signals that are generated by respective pixels according to the sensor driving signals may be transferred to the CDS 130 as output signals OUT. How the pixels PIX are arranged in the pixel array 110 will be described later in detail.

A color filter array (CFA) and lenses may be stacked on the pixel array 110. The color filter array may include red, green, and blue filters. Two or more different color filters may be disposed for each of the plurality of pixels PIX. For example, at least one blue color filter, at least one red color filter, and at least two green color filters may be disposed for each of the plurality of pixels PIX.

The row driver 120 may select one of a plurality of rows of the pixel array 110 under control of the timing controller 160. The row driver 120 generates the selection signal SEL for the purpose of selecting one or more of the plurality of rows. The row driver 120 may sequentially enable (or activate) the reset signal RG and the transfer signal TG associated with pixels corresponding to the selected row. As such, the illuminance-related output signals OUT generated from the pixels of the selected row may be sequentially provided to the CDS 130.

The CDS 130 may be connected with pixels included in a row selected by the selection signal SEL through column lines. The CDS 130 may detect pixel voltages respectively generated by pixels by performing correlated double sampling. For example, the CDS 130 may sample and hold a pixel voltage generated by each pixel. The CDS 130 may perform correlated double sampling on a level of a specific noise and a level of a pixel voltage output from each pixel, and may output a voltage of a level corresponding to a result of the correlated double sample, that is, a voltage corresponding to a level difference thereof. As such, the CDS 130 may detect a reset voltage when the reset signal RG is enabled and a pixel voltage corresponding to charges integrated in a photodiode of each pixel PIX.

The ADC 140 may convert the reset voltage and the pixel voltage detected by the CDS 130 into a digital signal. For example, the ADC 140 may convert the pixel voltage detected by the CDS 130 into a pixel signal. Pixel signals converted by the ADC 140, that is, digital signals may be provided to the output buffer 150.

The output buffer 150 may store the digital signals converted by the ADC 140. The output buffer 150 may transmit the digital signals stored therein to the image processor 11 as image data under control of the timing controller 160.

The timing controller 160 may control the pixel array 110, the row driver 120, the CDS 130, the ADC 140, and the output buffer 150. The timing controller 160 may generate control signals, which are necessary for operations of the pixel array 110, the row driver 120, the CDS 130, the ADC 140, and the output buffer 150, such as a clock signal and a timing control signal. According to a request received from the image processor 11, the timing controller 160 may generate the control signals and may provide the control signals to any other components of the image sensor 100.

The image processor 11 may process image data received from the output buffer 150. For example, the image processor 11 may calculate a phase difference between two pixels from the image data. The image processor 11 may perform auto-focus processing based on the calculated phase difference. The image processor 11 may correct image data of a pixel from which a pixel voltage is not detected, based on image data associated with pixels adjacent to the pixel from which the pixel voltage is not detected. The image data processed by the image processor 11 may be stored in a storage device or may be output to a display device.

Figure 2:
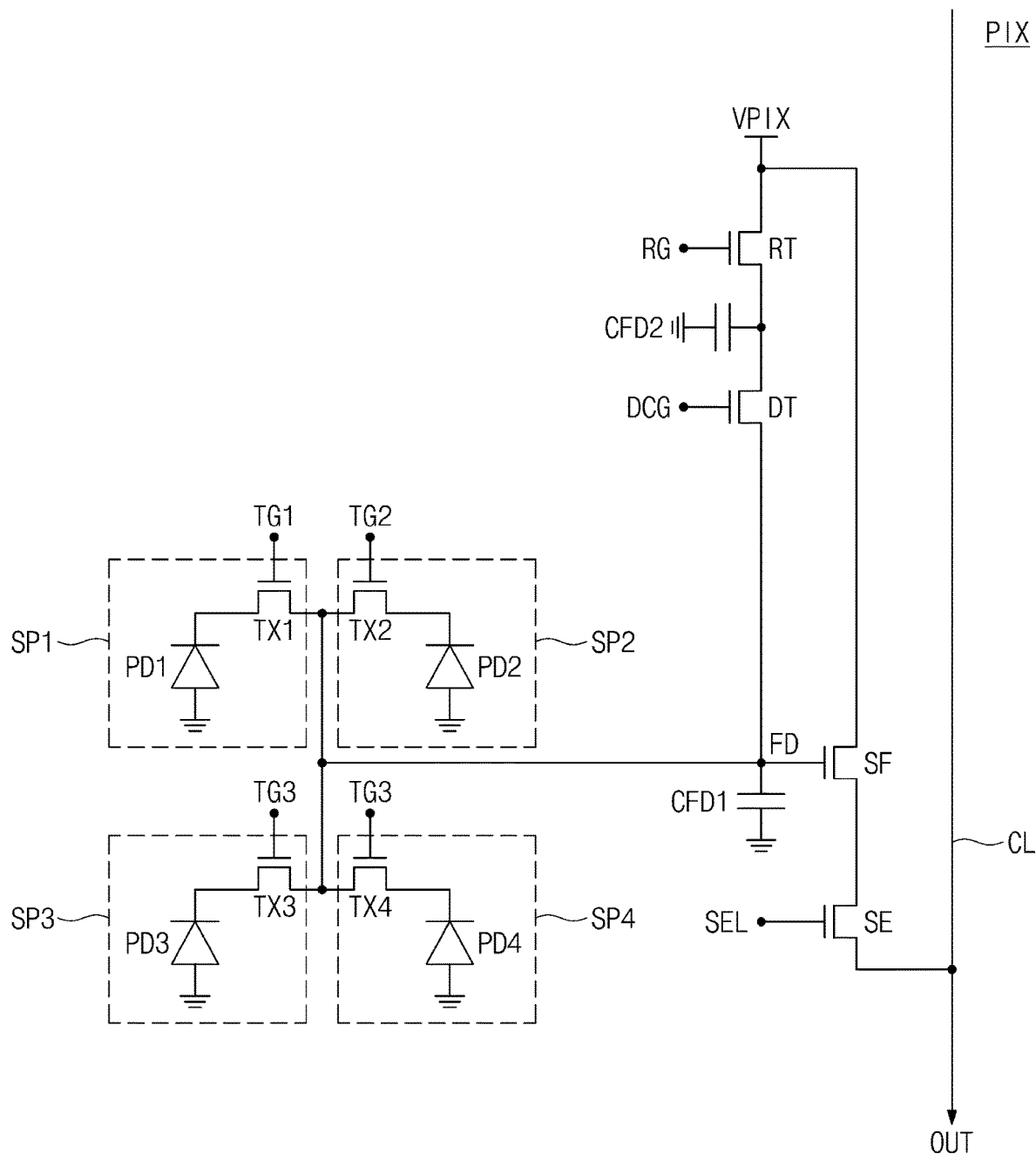
FIG. 2 is a circuit diagram of a pixel according to an example embodiment.

FIG. 2 is a circuit diagram of a pixel PIX, according to an example embodiment. For example, the pixel PIX of FIG. 2 may be provided in the pixel array 110 of FIG. 1. Referring to FIG. 2, the pixel PIX may include a reset transistor RT, a dual conversion transistor DT, a source follower transistor SF, a select transistor SE, and four sub-pixels SP1, SP2, SP3, and SP4.

Each of the sub-pixels SP1 to SP4 may further include a photoelectric conversion element and a transfer transistor. For example, the sub-pixel SP1 may include a photoelectric conversion element PD1 and a transfer transistor TX1; the sub-pixel SP2 may include a photoelectric conversion element PD2 and a transfer transistor TX2; the sub-pixel SP3 may include a photoelectric conversion element PD3 and a transfer transistor TX3; and the sub-pixel SP4 may include a photoelectric conversion element PD4 and a transfer transistor TX4.

The sub-pixels SP1 to SP4 may share the reset transistor RT, the dual conversion transistor DT, the source follower transistor SF, the select transistor SE, and a floating diffusion node FD. For example, the sub-pixels SP1 to SP4 may be connected in common with the floating diffusion node FD.

The transfer transistors TX1 to TX4 may transfer charges generated (or integrated) by the photoelectric conversion elements PD1 to PD4 to the floating diffusion node FD. For example, while the transfer transistor TX1 is turned on by a transfer signal TG1 received from the row driver 120, charges provided from the photoelectric conversion element PD1 may be accumulated in the floating diffusion node FD. Similar to the charges of the photoelectric conversion element PD1, charges provided from the photoelectric conversion elements PD2 to PD4 may be accumulated in the floating diffusion node FD depending on operations of the transfer transistors TX2 to TX4. First terminals of the transfer transistors TX1 to TX4 may be respectively connected with the photoelectric conversion elements PD1 to PD4, and second terminals of the transfer transistors TX1 to TX4 may be connected in common with the floating diffusion node FD.

The floating diffusion node FD may accumulate charges converted by at least one of the photoelectric conversion elements PD1 to PD4. For example, a capacitance of the floating diffusion node FD may correspond to a capacitance of a capacitor CFD1. The floating diffusion node FD may be connected with a gate of the source follower transistor SF. As such, a voltage potential corresponding to charges accumulated in the floating diffusion node FD may be formed.

The source follower transistor SF may include a gate connected with the floating diffusion node FD, a first terminal to which a voltage VPIX is applied, and a second terminal connected with the select transistor SE. The source follower transistor SF may operate as a source follower amplifier. For example, the source follower transistor SF may amplify a change of an electrical potential of the floating diffusion node FD and may generate a voltage (i.e., an output signal OUT) corresponding to the amplified change.

The select transistor SE may include a gate to which the selection signal SEL is applied, a first terminal connected with the second terminal of the source follower transistor SF, and a second terminal connected with a column line CL. The select transistor SE may select a pixel to be read in units of row according to the selection signal SEL. As the select transistor SE is turned on, the output signal OUT may be output through the column line CL.

The reset transistor RT may include a gate to which the reset signal RG is applied, a first terminal to which the voltage VPIX is applied, and a second terminal connected with the dual conversion transistor DT. When the reset transistor RT is turned on, a reset voltage (e.g., the voltage VPIX) may be provided to the floating diffusion node FD. As such, the charges accumulated in the floating diffusion node FD may move to a terminal for the voltage VPIX, and a voltage of the floating diffusion node FD may be reset to the voltage VPIX.

The dual conversion transistor DT may include a gate to which a dynamic conversion gain signal DCG is applied, a first terminal connected with the second terminal of the reset transistor RT, and a second terminal connected with the floating diffusion node FD. The dual conversion transistor DT may adjust a gain when voltages (or currents) generated by the photoelectric conversion elements PD1 to PD4 are transferred to the floating diffusion node FD. For example, when the dual conversion transistor DT is turned on, the floating diffusion node FD may be electrically connected with the second terminal of the reset transistor RT. In this case, the capacitance of the floating diffusion node FD may increase. For example, the capacitance of the floating diffusion node FD may be increased to a sum of the capacitance of the capacitor CFD1 and a capacitance of a capacitor CFD2.

When the capacitance of the floating diffusion node FD increases, there may be a decrease in gain of voltages (or currents) generated by the photoelectric conversion elements PD1 to PD4 that are transferred to the floating diffusion node FD. When the capacitance of the floating diffusion node FD decreases, there may be an increase in gain of voltages (or currents) generated by the photoelectric conversion elements PD1 to PD4 that are transferred to the floating diffusion node FD. The dual conversion transistor DT may dynamically adjust a range of the intensity of light sensed by the photoelectric conversion elements PD1 to PD4 by adjusting the capacitance of the floating diffusion node FD. As a result, a high dynamic range (HDR) may be implemented.

Figure 3:
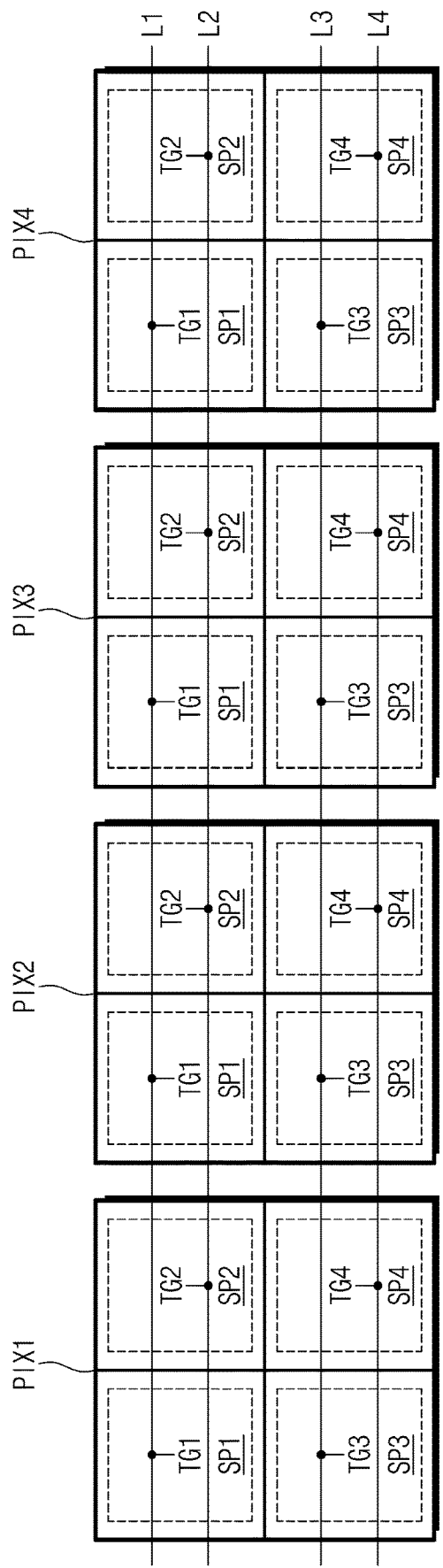
FIG. 3 illustrates pixels of the same row connected with corresponding metal lines, according to an example embodiment.

FIG. 3 illustrates pixels PIX1 to PIX4 of the same row connected with corresponding metal lines (e.g., at least one of metal lines L1 to L4), according to an example embodiment. For brevity of drawing, there are illustrated only metal lines, to which the transfer signals TG1 to TG4 are applied, from among components of the sub-pixels SP1 to SP4 included in one pixel. Each of the pixels PIX1 to PIX4 may be implemented to be similar to the pixel PIX of FIG. 2 and may operate similar to the pixel PIX of FIG. 2.

Referring to FIGS. 1, 2, and 3, one pixel (e.g., the pixel PIX1) may include four sub-pixels SP1 to SP4. It may be understood that the sub-pixels SP1 to SP4 of the pixel PIX1 form a 2×2 matrix.

The sub-pixels SP1 to SP4 of one pixel may receive the transfer signals TG1 to TG4 through metal lines L1 to L4. For example, the sub-pixel SP1 of the pixel PIX1 may receive the transfer signal TG1 from the metal line L1; the sub-pixel SP2 of the pixel PIX1 may receive the transfer signal TG2 from the metal line L2; the sub-pixel SP3 of the pixel PIX1 may receive the transfer signal TG3 from the metal line L3; and the sub-pixel SP4 of the pixel PIX1 may receive the transfer signal TG4 from the metal line L4. Similarly, the sub-pixels SP1 to SP4 of the pixels PIX2, PIX3, and PIX4 may also receive the transfer signals TG1 to TG4 through the metal lines L1 to L4.

The metal line L1 may be connected with the sub-pixel SP1 of the pixel PIX1, the sub-pixel SP1 of the pixel PIX2, the sub-pixel SP1 of the pixel PIX3, and the sub-pixel SP1 of the pixel PIX4. The signal OUT corresponding to charges converted by the photoelectric conversion element PD1 of the sub-pixel SP1 of the pixel PIX1, the photoelectric conversion element PD1 of the sub-pixel SP1 of the pixel PIX2, the photoelectric conversion element PD1 of the sub-pixel SP1 of the pixel PIX3, and the photoelectric conversion element PD1 of the sub-pixel SP1 of the pixel PIX4 may be output according to a signal transferred through the metal line L1.

Similarly, the signal OUT corresponding to charges converted by the photoelectric conversion element PD2 of the sub-pixel SP2 of the pixel PIX1, the photoelectric conversion element PD2 of the sub-pixel SP2 of the pixel PIX2, the photoelectric conversion element PD2 of the sub-pixel SP2 of the pixel PIX3, and the photoelectric conversion element PD2 of the sub-pixel SP2 of the pixel PIX4 may be output according to a signal transferred through the metal line L2. The signal OUT corresponding to charges converted by the photoelectric conversion element PD3 of the sub-pixel SP3 of the pixel PIX1, the photoelectric conversion element PD3 of the sub-pixel SP3 of the pixel PIX2, the photoelectric conversion element PD3 of the sub-pixel SP3 of the pixel PIX3, and the photoelectric conversion element PD3 of the sub-pixel SP3 of the pixel PIX4 may be output according to a signal transferred through the metal line L3. The signal OUT corresponding to charges converted by the photoelectric conversion element PD4 of the sub-pixel SP4 of the pixel PIX1, the photoelectric conversion element PD4 of the sub-pixel SP4 of the pixel PIX2, the photoelectric conversion element PD4 of the sub-pixel SP4 of the pixel PIX3, and the photoelectric conversion element PD4 of the sub-pixel SP4 of the pixel PIX4 may be output according to a signal transferred through the metal line L4.

Figures 4, 5:
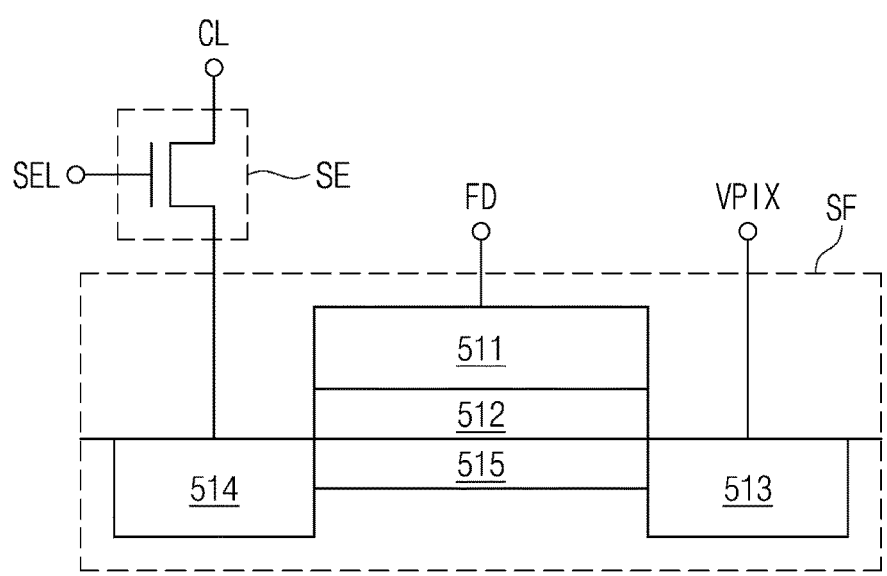
FIG. 4 illustrates an order in which sub-pixels are read out based on a wire structure of FIG. 3, according to an example embodiment.
FIG. 5 illustrates a source follower transistor and a select transistor of FIG. 2, according to an example embodiment.

FIG. 4 illustrates an order in which the sub-pixels SP1 to SP4 of each of pixels PIX1 to PIX8 are read out based on a wire structure of FIG. 3, according to an example embodiment.

A read-out operation may be performed for each row. As shown in FIG. 4, first, the read-out operation may be performed on the pixels PIX1 to PIX4, and the read-out operation may then be performed on the pixels PIX5 to PIX8. When the read-out operation is performed on one row, signals that are transferred through the metal lines L1, L2, L3, and L4 may be sequentially enabled.

During one period, pixel values of sub-pixels included in the selected row may be detected. A pixel value of one sub-pixel may be a level of a voltage (or current) corresponding to the amount of charges accumulated in a photoelectric conversion element of the sub-pixel.

First, the image sensor 100 may enable the reset signal RG to reset floating diffusion nodes included in the selected row. Afterwards, the reset signal RG may be disabled, and the selection signal SEL and a signal transferred through the metal line L1 may be enabled. As such, photoelectric conversion elements of sub-pixels connected with the metal line L1 may be electrically connected with corresponding floating diffusion nodes, respectively. Each of pixel values of the sub-pixels connected with the metal line L1 may be detected from the corresponding floating diffusion node through a corresponding select transistor and a corresponding column line. Afterwards, the floating diffusion nodes may again be reset, and a signal transferred through the metal line L2 may be enabled. As such, pixel values of sub-pixels connected with the metal line L2 may be detected. Similar to the above description, signals respectively transferred through the metal lines L3 and L4 may be sequentially enabled, and thus, pixel values of sub-pixels connected with the metal lines L3 and L4 may be sequentially detected.

As shown in FIG. 4, as the read-out operation is first performed on the pixels PIX1 to PIX4, the signal transferred through the metal line L1 may be firstly enabled. In this case, the pixel values of the sub-pixels SP1 of the pixels PIX1 to PIX4 may be detected. Secondly, a signal transferred through the metal line L2 may be enabled, and thus, pixel values of the sub-pixels SP2 of the pixels PIX1 to PIX4 may be detected. Thirdly, a signal transferred through the metal line L3 may be enabled, and thus, pixel values of the sub-pixels SP3 of the pixels PIX1 to PIX4 may be detected. Fourthly, a signal transferred through the metal line L4 may be enabled, and thus, pixel values of the sub-pixels SP4 of the pixels PIX1 to PIX4 may be detected.

Similarly, when the read-out operation is performed on the pixels PIX5 to PIX8, which are provided in another row, pixel values of the sub-pixels SP1 of the pixels PIX5 to PIX8 may be firstly detected, pixel values of the sub-pixels SP2 of the pixels PIX5 to PIX8 may be secondly detected, pixel values of the sub-pixels SP3 of the pixels PIX5 to PIX8 may be thirdly detected, and pixel values of the sub-pixels SP4 of the pixels PIX5 to PIX8 may be fourthly detected.

FIG. 5 illustrates the source follower transistor SF and the select transistor SE of FIG. 2, according to an example embodiment. Referring to FIGS. 1, 2, 3, 4, and 5, the source follower transistor SF may include a gate region 511, a gate oxide 512, a first source/drain region 513, a second source/drain region 514, and a channel region 515.

The first source/drain region 513 may be connected with a terminal to which the voltage VPIX is applied. As such, a voltage level of the first source/drain region 513 may be substantially equal to a level of the voltage VPIX. The gate region 511 may be connected with the floating diffusion node FD. The second source/drain region 514 may be connected with the first terminal of the select transistor SE.

In the read-out operation associated with one row, first, the reset signal RG may be enabled. As such, a level of a voltage of the floating diffusion node FD may be substantially equal to the level of the voltage VPIX.

As the source follower transistor SF operates in a saturation region, the voltage (i.e., the voltage VPIX) of the gate region 511 may form the channel region 515 between the first source/drain region 513 and the second source/drain region 514. As the channel region 515 is formed, the first source/drain region 513 and the second source/drain region 514 may be electrically connected. Because the select transistor SE is in a turn-off state, a voltage level of the second source/drain region 514 may also increase to the level of the voltage VPIX.

Because the voltages of the first source/drain region 513, the second source/drain region 514, and the gate region 511 are substantially equal to the voltage VPIX, there may be almost no potential difference between the regions 511, 513, and 514. In this case, electrons may not be trapped in the gate oxide 512 of the source follower transistor SF (or may be de-trapped therefrom). In other words, in a state where the reset transistor RT is turned on, the select transistor SE is turned off, and the transfer transistors TX1 to TX4 are turned off, the probability that the gate oxide 512 of the source follower transistor SF is in a state where electrons are not trapped therein is high.

As described above, to perform the read-out operation on the pixel PIX1, first, the reset signal RG may be enabled. Before the selection signal SEL to be applied to the select transistor SE of the pixel PIX1 is enabled, the probability that the gate oxide 512 of the source follower transistor SF is in a state where electrons are not trapped therein is high.

In the case where the selection signal SEL is enabled and the reset signal RG is disabled, the gate region 511 connected with the floating diffusion node FD may be floated, and the second source/drain region 514 may be connected with the column line CL through the turned-on select transistor SE. Next, as the transfer signal TG1 applied to the metal line L1 is enabled, the transfer transistor TX1 may be turned on. As such, charges accumulated in the photoelectric conversion element PD1 may be transferred to the floating diffusion node FD. In this case, a voltage of the gate region 511 (i.e., the floating diffusion node FD) may allow electrons to move from the first source/drain region 513 to the second source/drain region 514 through the channel region 515. While the electrons move through the channel region 515, some electrons may be trapped in the gate oxide 512.

Afterwards, the reset signal RB may be enabled again, the floating diffusion node FD may be reset when the reset signal RG is again enabled, and the transfer transistor TX2 may be turned on when the transfer signal TG2 applied to the metal line L2 is enabled. However, unlike the case where the transfer signal TG1 is enabled, some electrons may be already trapped in the gate oxide 512. The trapped electrons may affect a level of the output signal OUT transferred through the column line CL. Likewise, when the transfer signals TG3 and TG4 are respectively enabled, some electrons may be trapped in the gate oxides 512 thereof.

The trap (e.g., interface trap or oxide trap) of the gate oxide 512 described above may also occur in the remaining pixels PIX2 to PIX8 of FIG. 4. Accordingly, pixel values detected from the sub-pixels SP1 of the pixels PIX1 to PIX8 may be different in aspect from pixel values detected from the remaining sub-pixels SP2, SP3, and SP4 thereof. As such, an offset may occur in an output of the image sensor 100.

For example, due to the electron trap of the gate oxide 512, a pixel value firstly detected in each pixel (i.e., a pixel value detected from a sub-pixel connected with the metal line L1) may be output to be relatively high. In the case where a location in a pixel, at which a sub-pixel is connected with the metal line L1, is fixed to a specific point (e.g., in the case where the specific point is fixed as a location of the sub-pixel SP1), a random telegraph signal (RTS) noise may occur in a read-out result of the pixel array 110.

Figure 6:
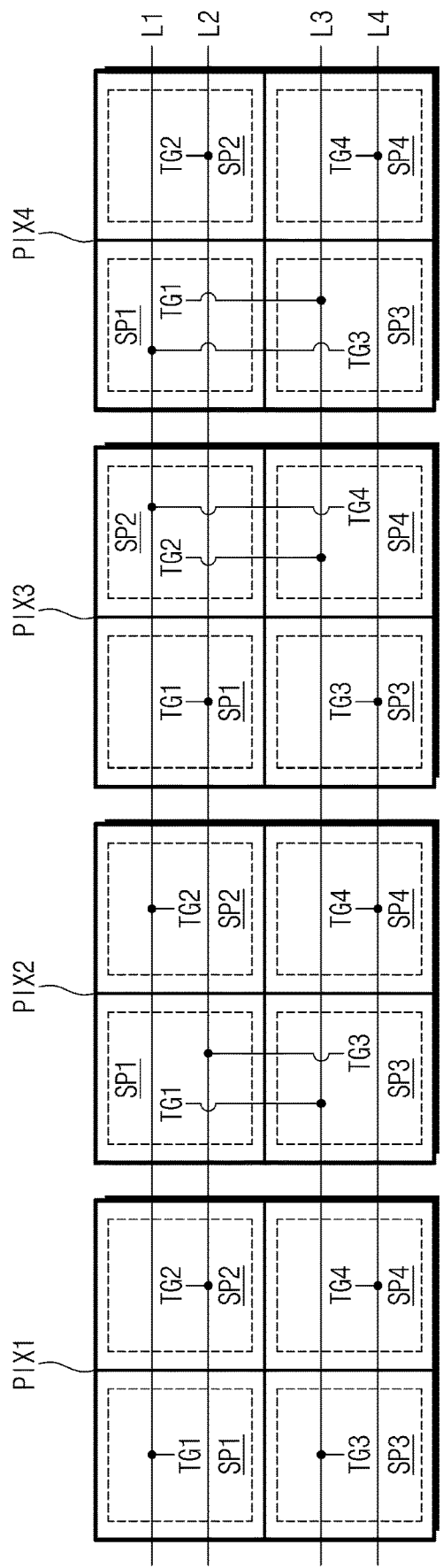
FIG. 6 illustrates pixels of the same row connected with corresponding metal lines, according to an example embodiment.

FIG. 6 illustrates pixels PIX1 to PIX4 of the same row connected with corresponding metal lines (e.g., at least one of metal lines L1 to L4), according to an example embodiment. Common features and different features of FIG. 3 and FIG. 6 will be described with reference to FIGS. 1, 2, 3, and 6.

As shown in FIG. 3, the number of sub-pixels connected with each of the metal lines L1 to L4 may be equal to the number of sub-pixels connected with each of the metal lines L1 to L4 shown in FIG. 6. For example, the number of sub-pixels connected with the metal line L1 in FIG. 3 is "4", and is equal to the number of sub-pixels connected with each of the remaining metal lines L2 to L4. Likewise, the number of sub-pixels connected with the metal line L1 in FIG. 6 is also "4", and is equal to the number of sub-pixels connected with each of the remaining metal lines L2 to L4.

However, unlike FIG. 3, as shown in FIG. 6, the connection relationship between the metal lines L1 to L4 and sub-pixels in pixels may vary. In this case, in all the pixels of the pixel array 110, the number of sub-pixels connected with each of the metal lines L1 to L4 may be maintained equally. For example, like FIG. 3, in FIG. 6, the sub-pixel SP1 of the pixel PIX1 may receive the transfer signal TG1 from the metal line L1; the sub-pixel SP2 of the pixel PIX1 may receive the transfer signal TG2 from the metal line L2; the sub-pixel SP3 of the pixel PIX1 may receive the transfer signal TG3 from the metal line L3; and the sub-pixel SP4 of the pixel PIX1 may receive the transfer signal TG4 from the metal line L4.

However, unlike the pixel PIX2 of FIG. 3, in the pixel PIX2 of FIG. 6, the sub-pixel SP1 may be connected with the metal line L3 to receive the transfer signal TG1, the sub-pixel SP2 may be connected with the metal line L1 to receive the transfer signal TG2, the sub-pixel SP3 may be connected with the metal line L2 to receive the transfer signal TG3, and the sub-pixel SP4 may be connected with the metal line L4 to receive the transfer signal TG4.

Also, unlike the pixel PIX3 of FIG. 3, in the pixel PIX3 of FIG. 6, the sub-pixel SP1 may be connected with the metal line L2 to receive the transfer signal TG1, the sub-pixel SP2 may be connected with the metal line L3 to receive the transfer signal TG2, the sub-pixel SP3 may be connected with the metal line L4 to receive the transfer signal TG3, and the sub-pixel SP4 may be connected with the metal line L1 to receive the transfer signal TG4.

In addition, unlike the pixel PIX4 of FIG. 3, in the pixel PIX4 of FIG. 6, the sub-pixel SP1 may be connected with the metal line L3 to receive the transfer signal TG1, the sub-pixel SP2 may be connected with the metal line L2 to receive the transfer signal TG2, the sub-pixel SP3 may be connected with the metal line L1 to receive the transfer signal TG3, and the sub-pixel SP4 may be connected with the metal line L4 to receive the transfer signal TG4.

FIG. 7 illustrates an order in which the sub-pixels SP1 to SP4 of each of the pixels PIX1 to PIX8 are read out based on a wire structure of FIG. 6, according to an example embodiment. Referring to FIGS. 1, 2, 6, and 7, the read-out operation may be performed on the pixels PIX1 to PIX4, and the read-out operation may then be performed on the pixels PIX5 to PIX8.

The transfer signal TG1 that is applied to the transfer transistor TX1 of the sub-pixel SP1 in the pixel PIX5 may be provided through the metal line L2. The transfer signal TG2 that is applied to the transfer transistor TX2 of the sub-pixel SP2 in the pixel PIX5 may be provided through the metal line L1. The transfer signal TG3 that is applied to the transfer transistor TX3 of the sub-pixel SP3 in the pixel PIX5 may be provided through the metal line L3. The transfer signal TG4 that is applied to the transfer transistor TX4 of the sub-pixel SP4 in the pixel PIX5 may be provided through the metal line L4.

The transfer signal TG1 that is applied to the transfer transistor TX1 of the sub-pixel SP1 in the pixel PIX6 may be provided through the metal line L3. The transfer signal TG2 that is applied to the transfer transistor TX2 of the sub-pixel SP2 in the pixel PIX6 may be provided through the metal line L2. The transfer signal TG3 that is applied to the transfer transistor TX3 of the sub-pixel SP3 in the pixel PIX6 may be provided through the metal line L4. The transfer signal TG4 that is applied to the transfer transistor TX4 of the sub-pixel SP4 in the pixel PIX6 may be provided through the metal line L1.

The transfer signal TG1 that is applied to the transfer transistor TX1 of the sub-pixel SP1 in the pixel PIX7 may be provided through the metal line L3. The transfer signal TG2 that is applied to the transfer transistor TX2 of the sub-pixel SP2 in the pixel PIX7 may be provided through the metal line L2. The transfer signal TG3 that is applied to the transfer transistor TX3 of the sub-pixel SP3 in the pixel PIX7 may be provided through the metal line L1. The transfer signal TG4 that is applied to the transfer transistor TX4 of the sub-pixel SP4 in the pixel PIX7 may be provided through the metal line L4.

The transfer signal TG1 that is applied to the transfer transistor TX1 of the sub-pixel SP1 in the pixel PIX8 may be provided through the metal line L4. The transfer signal TG2 that is applied to the transfer transistor TX2 of the sub-pixel SP2 in the pixel PIX8 may be provided through the metal line L3. The transfer signal TG3 that is applied to the transfer transistor TX3 of the sub-pixel SP3 in the pixel PIX8 may be provided through the metal line L2. The transfer signal TG4 that is applied to the transfer transistor TX4 of the sub-pixel SP4 in the pixel PIX8 may be provided through the metal line L1.

When the read-out operation is performed on the pixels PIX1 to PIX4, the signal transferred through the metal line L1 may be firstly enabled. As such, pixel values of the sub-pixel SP1 of the pixel PIX1, the sub-pixel SP2 of the pixel PIX2, the sub-pixel SP4 of the pixel PIX3, and the sub-pixel SP3 of the pixel PIX4 may be detected.

Secondly, the signal transferred through the metal line L2 may be enabled. As such, pixel values of the sub-pixel SP2 of the pixel PIX1, the sub-pixel SP3 of the pixel PIX2, the sub-pixel SP1 of the pixel PIX3, and the sub-pixel SP2 of the pixel PIX4 may be detected.

Thirdly, the signal transferred through the metal line L3 may be enabled. As such, pixel values of the sub-pixel SP3 of the pixel PIX1, the sub-pixel SP1 of the pixel PIX2, the sub-pixel SP2 of the pixel PIX3, and the sub-pixel SP1 of the pixel PIX4 may be detected.

Fourthly, the signal transferred through the metal line L4 may be enabled. As such, pixel values of the sub-pixel SP4 of the pixel PIX1, the sub-pixel SP4 of the pixel PIX2, the sub-pixel SP3 of the pixel PIX3, and the sub-pixel SP4 of the pixel PIX4 may be detected.

As in the above description, when the read-out operation is performed on the pixels PIX5 to PIX8, the signal transferred through the metal line L1 may be firstly enabled. As such, pixel values of the sub-pixel SP2 of the pixel PIX5, the sub-pixel SP4 of the pixel PIX6, the sub-pixel SP3 of the pixel PIX7, and the sub-pixel SP4 of the pixel PIX8 may be detected.

Secondly, the signal transferred through the metal line L2 may be enabled. As such, pixel values of the sub-pixel SP1 of the pixel PIX5, the sub-pixel SP2 of the pixel PIX6, the sub-pixel SP2 of the pixel PIX7, and the sub-pixel SP3 of the pixel PIX8 may be detected.

Thirdly, the signal transferred through the metal line L3 may be enabled. As such, pixel values of the sub-pixel SP3 of the pixel PIX5, the sub-pixel SP1 of the pixel PIX6, the sub-pixel SP1 of the pixel PIX7, and the sub-pixel SP2 of the pixel PIX8 may be detected.

Fourthly, the signal transferred through the metal line L4 may be enabled. As such, pixel values of the sub-pixel SP4 of the pixel PIX5, the sub-pixel SP3 of the pixel PIX6, the sub-pixel SP4 of the pixel PIX7, and the sub-pixel SP1 of the pixel PIX8 may be detected.

Unlike the pixels PIX1 to PIX8 of FIG. 4, locations of sub-pixels connected with the metal line L1 may be different in the pixels PIX1 to PIX8. Accordingly, locations of sub-pixels whose pixel values have no influence of the charge trap of the gate oxide 512 described with reference to FIG. 5 may be different in the pixels PIX1 to PIX8. For example, in FIG. 4, a sub-pixel whose pixel value has no influence of the charge trap of the gate oxide 512 may be fixed to the sub-pixel SP1 of each pixel. However, in FIG. 7, the order of reading out sub-pixels of pixels (or the order of enabling driving signals) may vary (i.e., may not be fixed), and thus, sub-pixels whose pixel values have no influence of the charge trap of the gate oxide 512 may change throughout the pixels. In this case, an output offset due to the charge trap of the gate oxide 512 may be canceled out, and thus, the RTS noise may be reduced.

Figure 8:
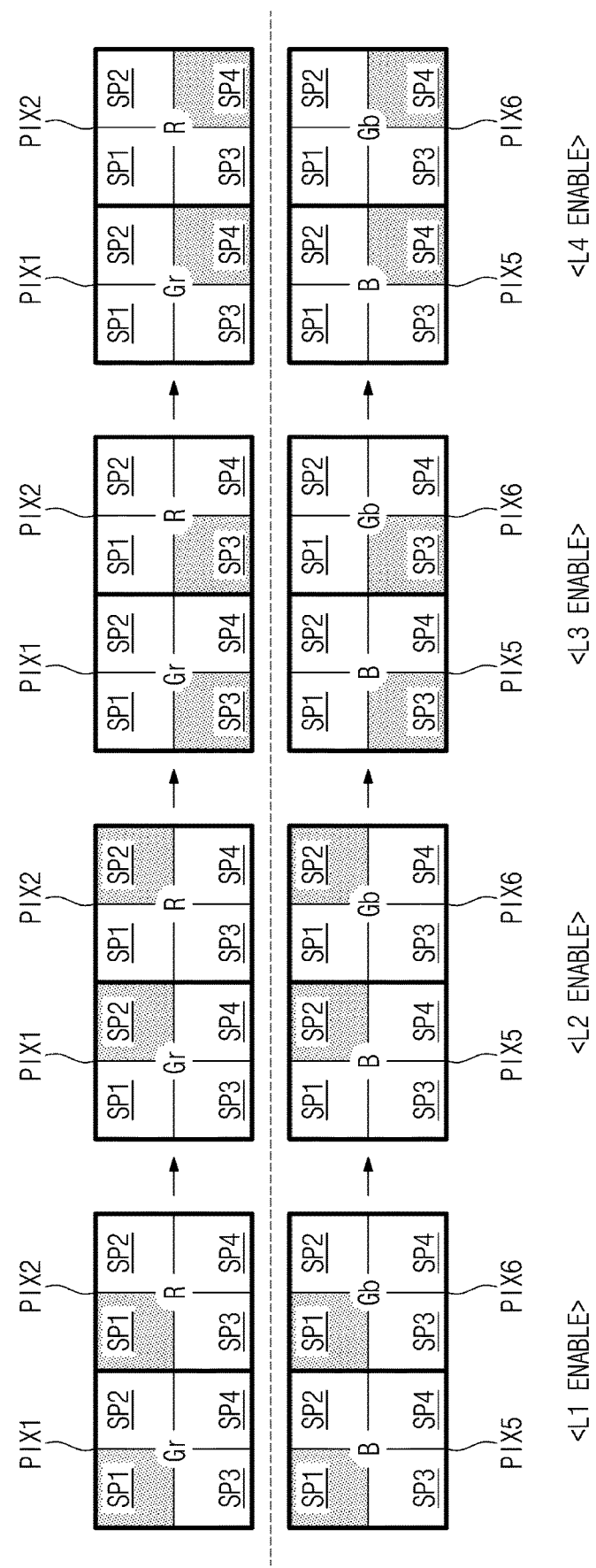
FIG. 8 illustrates a flow in which sub-pixels are read out based on a wire structure of FIG. 4, according to an example embodiment.
Figure 9:
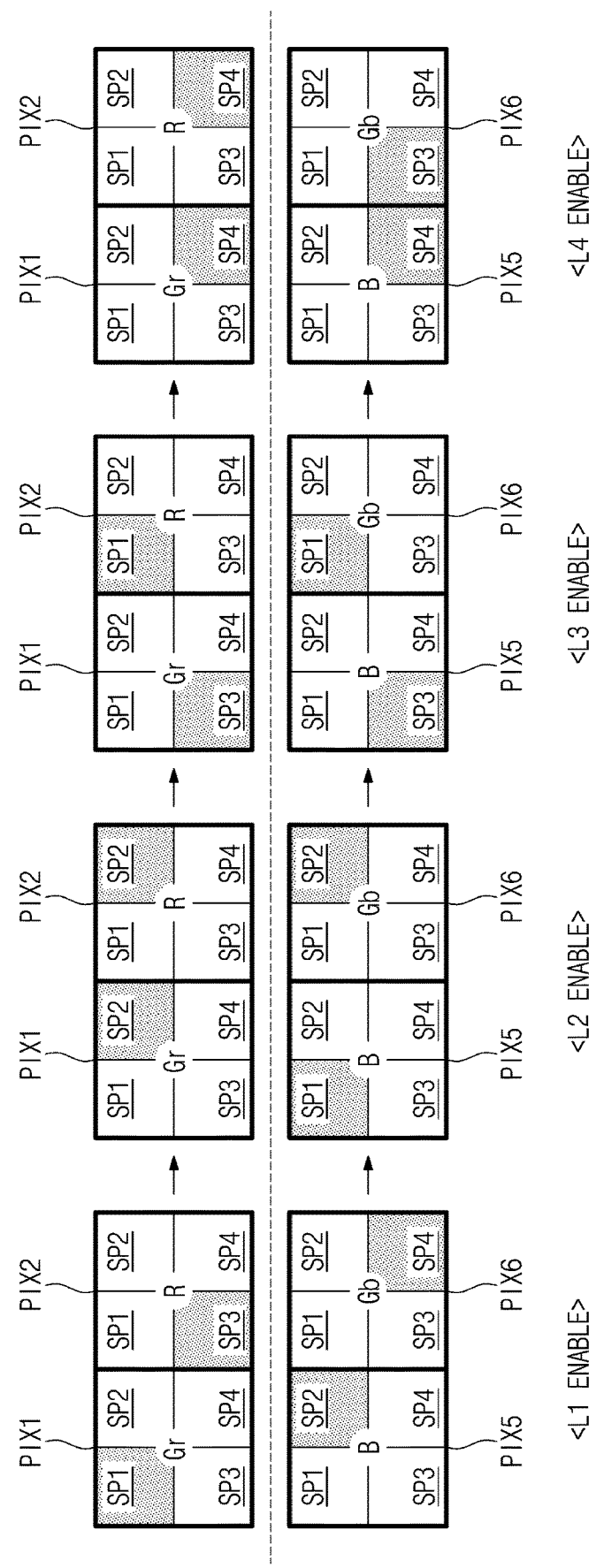
FIG. 9 illustrates a flow in which sub-pixels are read out based on a wire structure of FIG. 6, according to an example embodiment.

FIG. 8 illustrates a flow in which the sub-pixels SP1 to SP4 of each of pixels PIX1, PIX2, PIX5, and PIX6 are read out based on a wire structure of FIG. 4, according to an example embodiment. FIG. 9 illustrates a flow in which the sub-pixels SP1 to SP4 of each of pixels PIX1, PIX2, PIX5, and PIX6 are read out based on a wire structure of FIG. 6, according to an example embodiment.

As shown in FIGS. 8 and 9, one of red (R), green (Gr/Gb), and blue (B) color filters may be disposed on each of the pixels PIX1, PIX2, PIX5, and PIX6. For example, the green color filter may be disposed on each of the pixel PIX1 and the pixel PIX6, the red color filter may be disposed on the pixel PIX2, and the blue color filter may be disposed on the pixel PIX5.

As described above, the read-out operation may be performed on the pixels PIX1 and PIX2, and the read-out operation may then be performed on the pixels PIX5 and PIX6. While the read-out operation is performed on each row, the signals that are transferred through the metal lines L1, L2, L3, and L4 may be sequentially enabled.

As shown in FIG. 8, when the signal transferred through the metal line L1 is enabled in each read-out operation, pixel values may be respectively detected from the sub-pixel SP1 of the pixel PIX1, the sub-pixel SP1 of the pixel PIX2, the sub-pixel SP1 of the pixel PIX5, and the sub-pixel SP1 of the pixel PIX6. Accordingly, in each of the pixels PIX1, PIX2, PIX5, and PIX6, a sub-pixel having a relatively high pixel value is fixed to the sub-pixel SP1.

In contrast, in FIG. 9, when the signal transferred through the metal line L1 is enabled in each read-out operation, pixel values may be respectively detected from the sub-pixel SP1 of the pixel PIX1, the sub-pixel SP3 of the pixel PIX2, the sub-pixel SP2 of the pixel PIX5, and the sub-pixel SP4 of the pixel PIX6. Accordingly, in each of the pixels PIX1, PIX2, PIX5, and PIX6, a sub-pixel having a relatively high pixel value is not fixed to any one sub-pixel. This may mean that in each pixel, a pixel value of a sub-pixel at a specific location is not greater or smaller than pixel values of the remaining sub-pixels. As a result, an offset may be prevented from occurring due to a dark current based on the interface trap of the source follower transistor SF. Accordingly, the noise of the image sensor 100 may be reduced, and the accuracy of the image sensor 100 may be improved.

Figure 10:
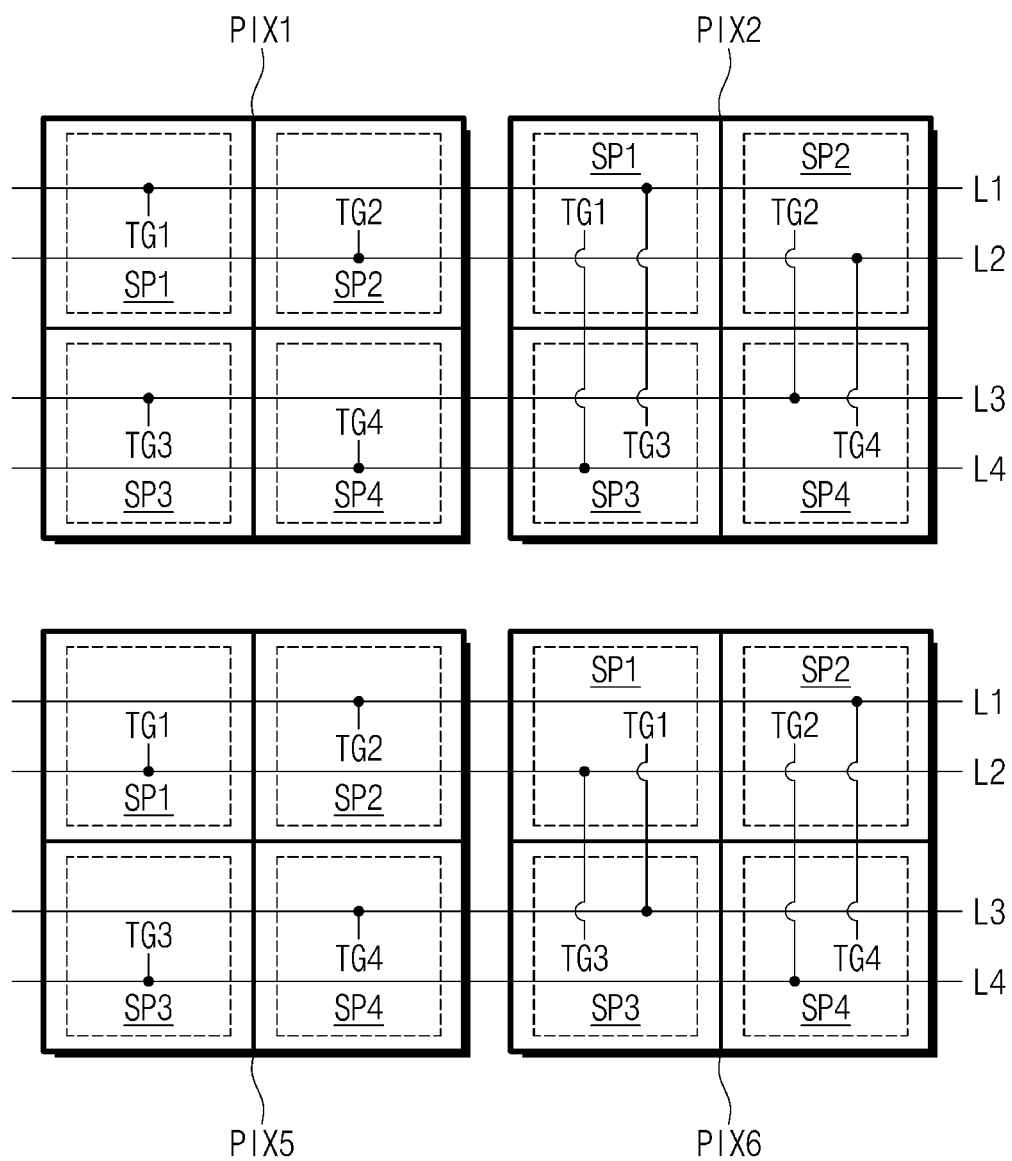
FIG. 10 illustrates pixels connected with corresponding metal lines, according to an example embodiment.

FIG. 10 illustrates the pixels PIX1, PIX2, PIX5, and PIX6 connected with corresponding metal lines (e.g., at least one of the metal lines L1 to L4), according to an example embodiment.

Referring to FIGS. 1, 2, and 10, the pixels PIX1 and PIX2 may belong to the same row, and the pixels PIX5 and PIX6 may belong to a next row. Accordingly, the read-out operation may be performed on the pixels PIX1 and PIX2, and the read-out operation may then be performed on the pixels PIX5 and PIX6.

As described above with reference to FIG. 6, and as shown in FIG. 10, the connection relationship between the metal lines L1 to L4 and sub-pixels in one pixel may vary. For example, like FIG. 3, in FIG. 10, the sub-pixel SP1 of the pixel PIX1 may receive the transfer signal TG1 from the metal line L1; the sub-pixel SP2 of the pixel PIX1 may receive the transfer signal TG2 from the metal line L2; the sub-pixel SP3 of the pixel PIX1 may receive the transfer signal TG3 from the metal line L3; and the sub-pixel SP4 of the pixel PIX1 may receive the transfer signal TG4 from the metal line L4.

However, unlike the pixel PIX2 of FIG. 3, in the pixel PIX2 of FIG. 10, the sub-pixel SP1 may be connected with the metal line L4 to receive the transfer signal TG1, the sub-pixel SP2 may be connected with the metal line L3 to receive the transfer signal TG2, the sub-pixel SP3 may be connected with the metal line L1 to receive the transfer signal TG3, and the sub-pixel SP4 may be connected with the metal line L2 to receive the transfer signal TG4.

Also, in the pixel PIX5 of FIG. 10, the sub-pixel SP1 may be connected with the metal line L2 to receive the transfer signal TG1, the sub-pixel SP2 may be connected with the metal line L1 to receive the transfer signal TG2, the sub-pixel SP3 may be connected with the metal line L4 to receive the transfer signal TG3, and the sub-pixel SP4 may be connected with the metal line L3 to receive the transfer signal TG4.

Also, in the pixel PIX6 of FIG. 10, the sub-pixel SP1 may be connected with the metal line L3 to receive the transfer signal TG1, the sub-pixel SP2 may be connected with the metal line L4 to receive the transfer signal TG2, the sub-pixel SP3 may be connected with the metal line L2 to receive the transfer signal TG3, and the sub-pixel SP4 may be connected with the metal line L1 to receive the transfer signal TG4.

Figure 11:
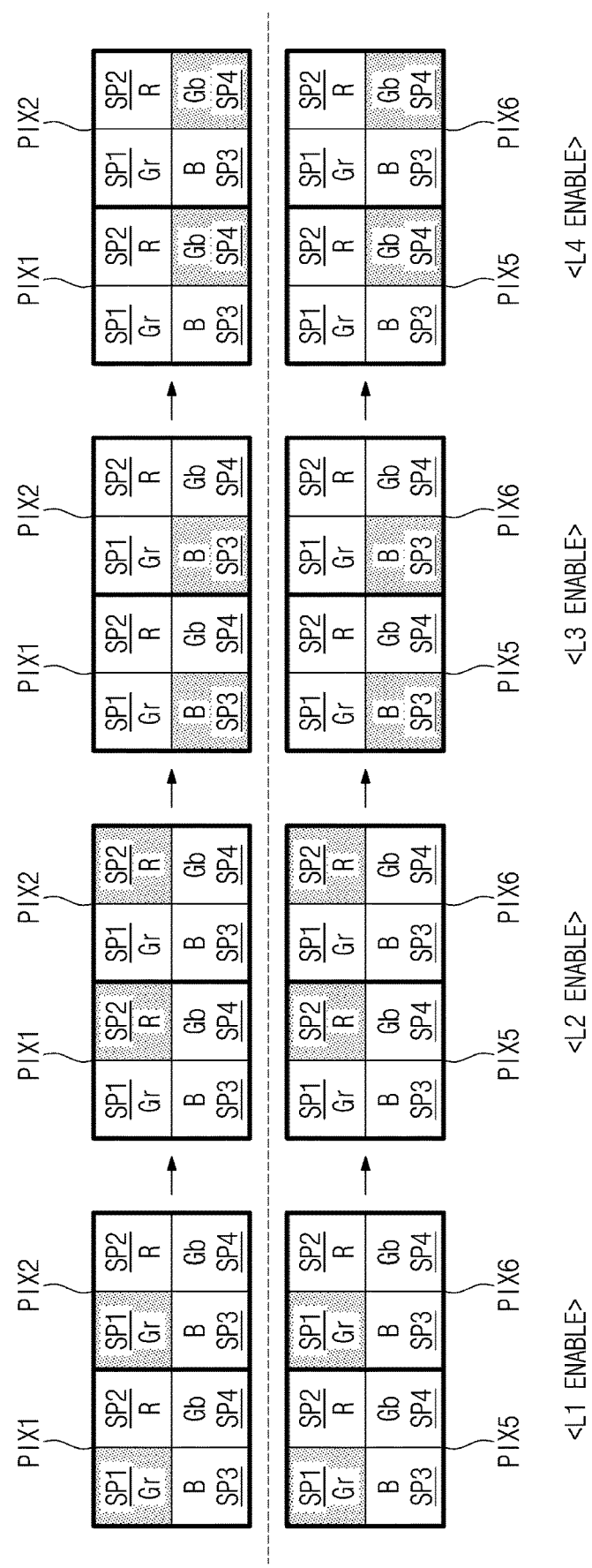
FIG. 11 illustrates a flow in which sub-pixels are read out based on a wire structure of FIG. 4, according to an example embodiment.
Figure 12:
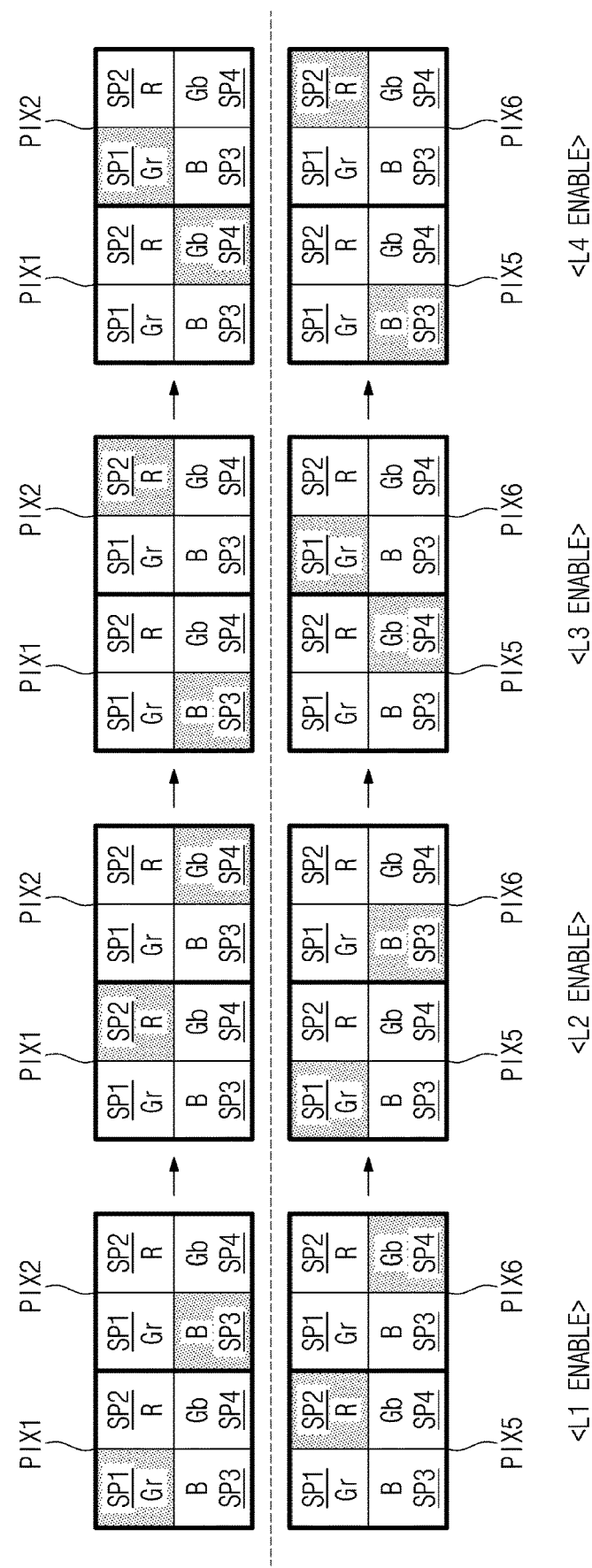
FIG. 12 illustrates a flow in which sub-pixels are read out based on a wire structure of FIG. 10, according to an example embodiment.

FIG. 11 illustrates a flow in which the sub-pixels SP1 to SP4 of each of pixels PIX1, PIX2, PIX5, and PIX6 are read out based on a wire structure of FIG. 4, according to an example embodiment. FIG. 12 illustrates an order in which the sub-pixels SP1 to SP4 of each of pixels PIX1, PIX2, PIX5, and PIX6 are read out based on a wire structure of FIG. 10, according to an example embodiment.

As shown in FIGS. 11 and 2, one of red (R), green (Gr/Gb), and blue (B) color filters may be disposed on each sub-pixel. For example, in all the pixels PIX1, PIX2, PIX5, and PIX6, the green color filter may be disposed on each of the sub-pixel SP1 and the sub-pixel SP4, the red color filter may be disposed on the sub-pixel SP2, and the blue color filter may be disposed on the sub-pixel SP3.

As described above, the read-out operation may be performed on the pixels PIX1 and PIX2, and the read-out operation may then be performed on the pixels PIX5 and PIX6. While the read-out operation is performed on each row, the signals that are transferred through the metal lines L1, L2, L3, and L4 may be sequentially enabled.

As shown in FIG. 11, when the signal transferred through the metal line L1 is enabled in each read-out operation, pixel values may be respectively detected from the sub-pixel SP1 of the pixel PIX1, the sub-pixel SP1 of the pixel PIX2, the sub-pixel SP1 of the pixel PIX5, and the sub-pixel SP1 of the pixel PIX6. Accordingly, in each of the pixels PIX1, PIX2, PIX5, and PIX6, a sub-pixel and color having a relatively high pixel value is fixed to the sub-pixel SP1.

In contrast, as shown in FIG. 12, when the signal transferred through the metal line L1 is enabled in each read-out operation, pixel values may be respectively detected from the sub-pixel SP1 of the pixel PIX1, the sub-pixel SP3 of the pixel PIX2, the sub-pixel SP2 of the pixel PIX5, and the sub-pixel SP4 of the pixel PIX6. Accordingly, in each of the pixels PIX1, PIX2, PIX5, and PIX6, a sub-pixel having a relatively high pixel value is not fixed to any one sub-pixel, or color. This may mean that in each pixel, a pixel value of a sub-pixel at a specific location is not greater or smaller than pixel values of the remaining sub-pixels. Accordingly, the noise of the image sensor 100 may be reduced, and the accuracy of the image sensor 100 may be improved.

Figure 13:
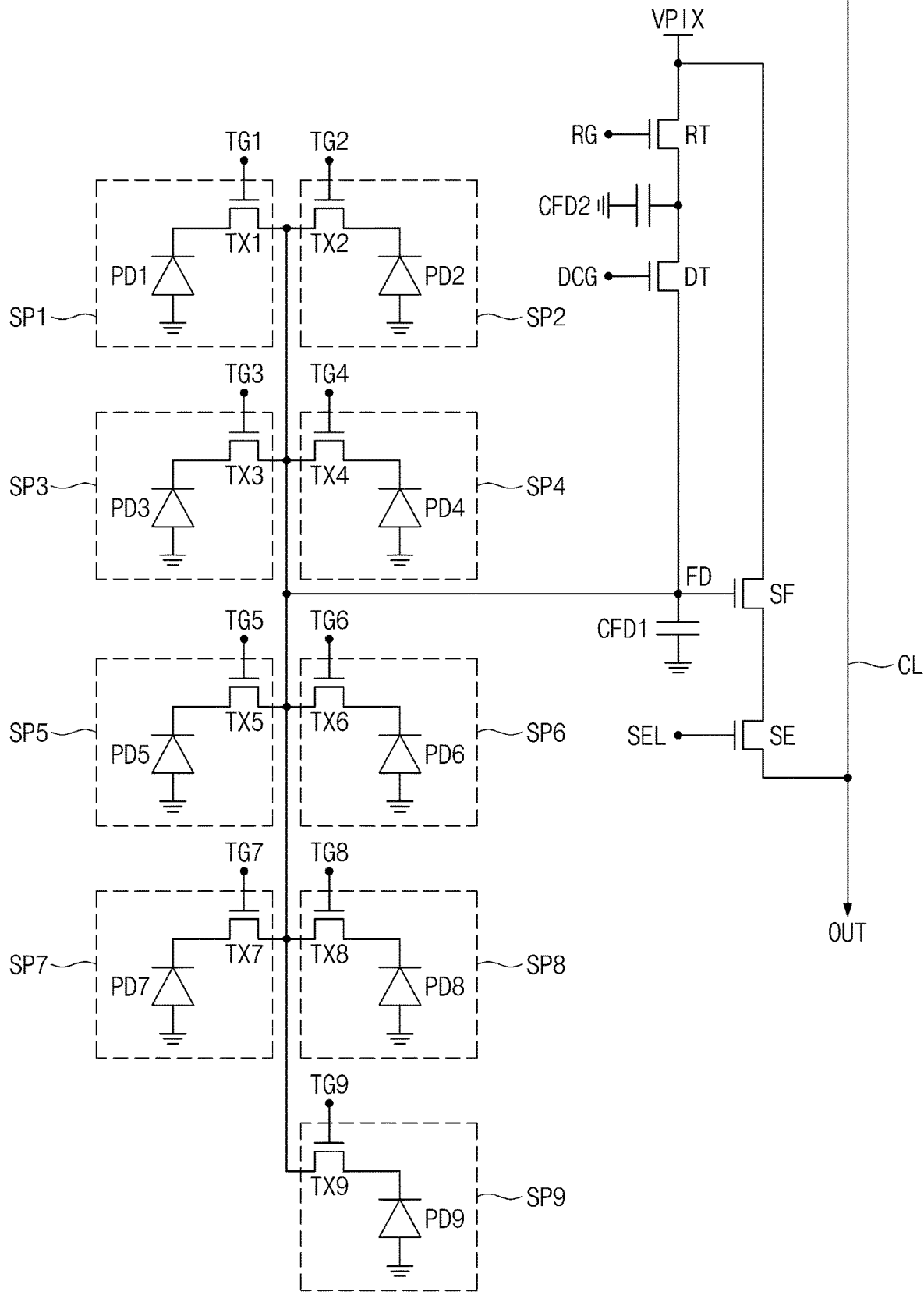
FIG. 13 is a circuit diagram of a pixel according to an example embodiment.

FIG. 13 is a circuit diagram of a pixel PIX of FIG. 1, according to an example embodiment. Referring to FIGS. 1 and 13, unlike FIG. 2, the pixel PIX of FIG. 13 may include nine sub-pixels SP1 to SP9. Additional description associated with components denoted by the same reference signs will be omitted to avoid redundancy, and different features of FIG. 2 and FIG. 13 will be described.

Each of the sub-pixels SP1 to SP9 may include a photoelectric conversion element and a transfer transistor. For example, the sub-pixel SP1 may include the photoelectric conversion element PD1 and the transfer transistor TX1; the sub-pixel SP2 may include the photoelectric conversion element PD2 and the transfer transistor TX2; the sub-pixel SP3 may include the photoelectric conversion element PD3 and the transfer transistor TX3; the sub-pixel SP4 may include the photoelectric conversion element PD4 and the transfer transistor TX4; the sub-pixel SP5 may include the photoelectric conversion element PD5 and the transfer transistor TX5; the sub-pixel SP6 may include the photoelectric conversion element PD6 and the transfer transistor TX6; the sub-pixel SP7 may include the photoelectric conversion element PD7 and the transfer transistor TX7; the sub-pixel SP8 may include the photoelectric conversion element PD8 and the transfer transistor TX8; and the sub-pixel SP9 may include the photoelectric conversion element PD9 and the transfer transistor TX9. The sub-pixels SP1 to SP9 may be connected in common with the floating diffusion node FD.

A transfer signal TG1 may be applied to a gate of the transfer transistor TX1; a transfer signal TG2 may be applied to a gate of the transfer transistor TX2; a transfer signal TG3 may be applied to a gate of the transfer transistor TX3; a transfer signal TG4 may be applied to a gate of the transfer transistor TX4; a transfer signal TG5 may be applied to a gate of the transfer transistor TX5; a transfer signal TG6 may be applied to a gate of the transfer transistor TX6; a transfer signal TG7 may be applied to a gate of the transfer transistor TX7; a transfer signal TG8 may be applied to a gate of the transfer transistor TX8; and a transfer signal TG9 may be applied to a gate of the transfer transistor TX9.

Figure 14:
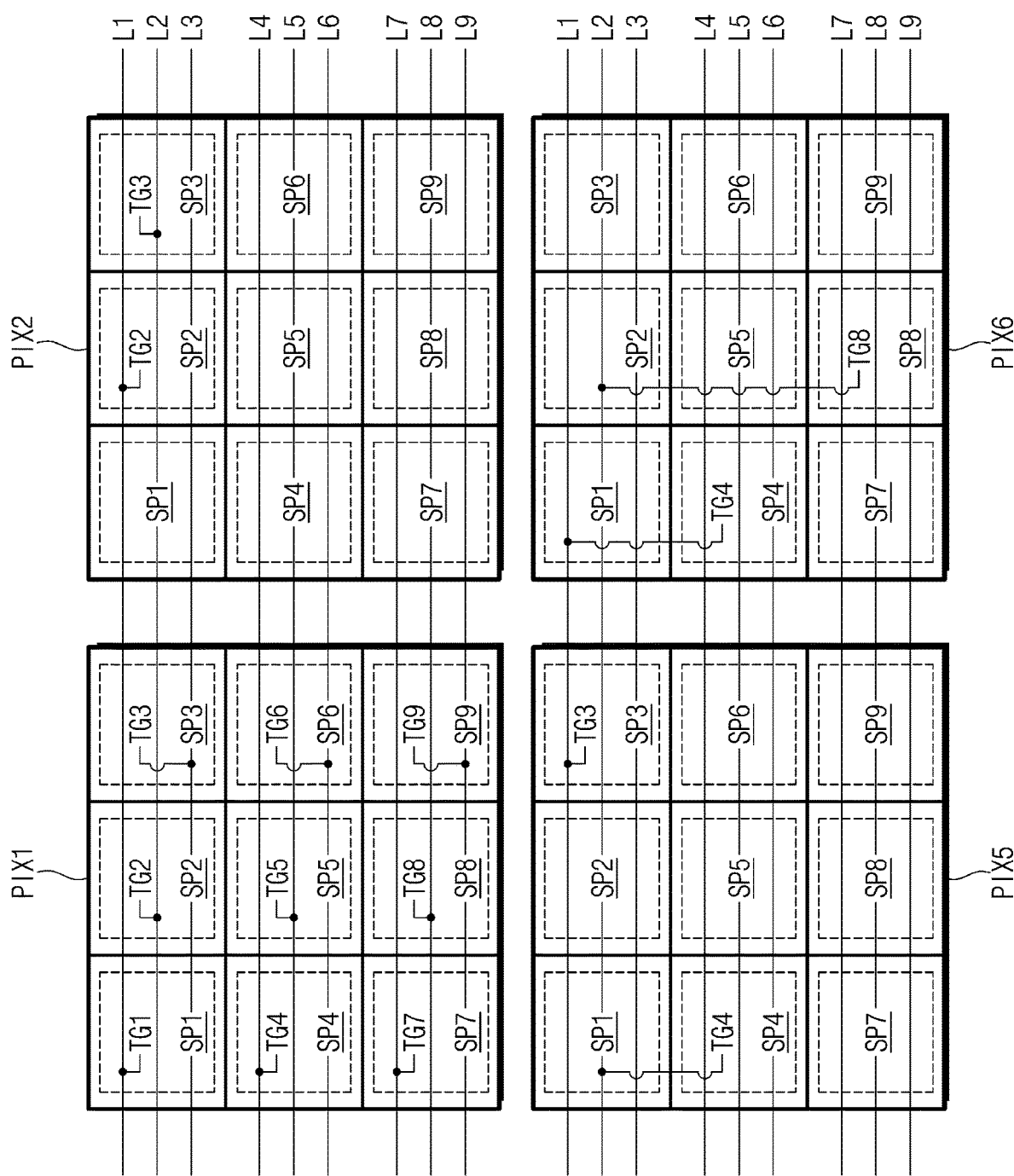
FIG. 14 illustrates pixels each including nine sub-pixels, according to an example embodiment.

FIG. 14 illustrates the pixels PIX1, PIX2, PIX5, and PIX6 each including nine sub-pixels, according to an example embodiment. Referring to FIGS. 1, 13, and 14, the pixels PIX1, PIX2, PIX5, and PIX6 of FIG. 14 may be implemented to be similar to that of the pixel PIX of FIG. 13 and may operate to be similar to that of the pixel PIX of FIG. 13. When the read-out operation is performed on one row, signals that are transferred through the metal lines L1 to L9 may be sequentially enabled. For brevity of drawing, only driving signals transferred through the metal line L1 and the metal line L2 are illustrated in the pixels PIX2, PIX5, and PIX6.

One pixel (e.g., the pixel PIX1) may include nine sub-pixels SP1 to SP9. It may be understood that the sub-pixels SP1 to SP9 of the pixel PIX1 form a 3×3 matrix.

Each of the sub-pixels SP1 to SP9 belonging to each of the pixels PIX1, PIX2, PIX5, and PIX6 may be connected with one of the metal lines L1 to L9. For example, the sub-pixel SP1 of the pixel PIX1 may receive the transfer signal TG1 from the metal line L1; the sub-pixel SP2 of the pixel PIX1 may receive the transfer signal TG2 from the metal line L2; the sub-pixel SP3 of the pixel PIX1 may receive the transfer signal TG3 from the metal line L3; the sub-pixel SP4 of the pixel PIX1 may receive the transfer signal TG4 from the metal line L4; the sub-pixel SP5 of the pixel PIX1 may receive the transfer signal TG5 from the metal line L5; the sub-pixel SP6 of the pixel PIX1 may receive the transfer signal TG6 from the metal line L6; the sub-pixel SP7 of the pixel PIX1 may receive the transfer signal TG7 from the metal line L7; the sub-pixel SP8 of the pixel PIX1 may receive the transfer signal TG8 from the metal line L8; and the sub-pixel SP9 of the pixel PIX1 may receive the transfer signal TG9 from the metal line L9.

Unlike FIG. 3, as described above with reference to FIG. 6, the connection relationship between the metal lines L1 to L9 and sub-pixels in one pixel may vary. However, in all the pixels of the pixel array 110, the number of sub-pixels connected with each of the metal lines L1 to L9 may be maintained equally.

For example, unlike the pixel PIX1, the metal line L1 may be connected with the sub-pixel SP2 of the pixel PIX2 to transfer the transfer signal TG2, and the metal line L2 may be connected with the sub-pixel SP3 of the pixel PIX2 to transfer the transfer signal TG3. As another example, unlike the pixel PIX1, the metal line L1 may be connected with the sub-pixel SP3 of the pixel PIX5 to transfer the transfer signal TG3, and the metal line L2 may be connected with the sub-pixel SP4 of the pixel PIX5 to transfer the transfer signal TG4. As another example, unlike the pixel PIX1, the metal line L1 may be connected with the sub-pixel SP4 of the pixel PIX6 to transfer the transfer signal TG4, and the metal line L2 may be connected with the sub-pixel SP8 of the pixel PIX8 to transfer the transfer signal TG4.

In some example embodiments, one of red (R), green (Gr/Gb), and blue (B) color filters may be disposed on each of the pixels PIX1, PIX2, PIX5, and PIX6 of FIG. 14. For example, the green color filter may be disposed on each of the pixel PIX1 and the pixel PIX6, the red color filter may be disposed on the pixel PIX2, and the blue color filter may be disposed on the pixel PIX5.

Figure 15:
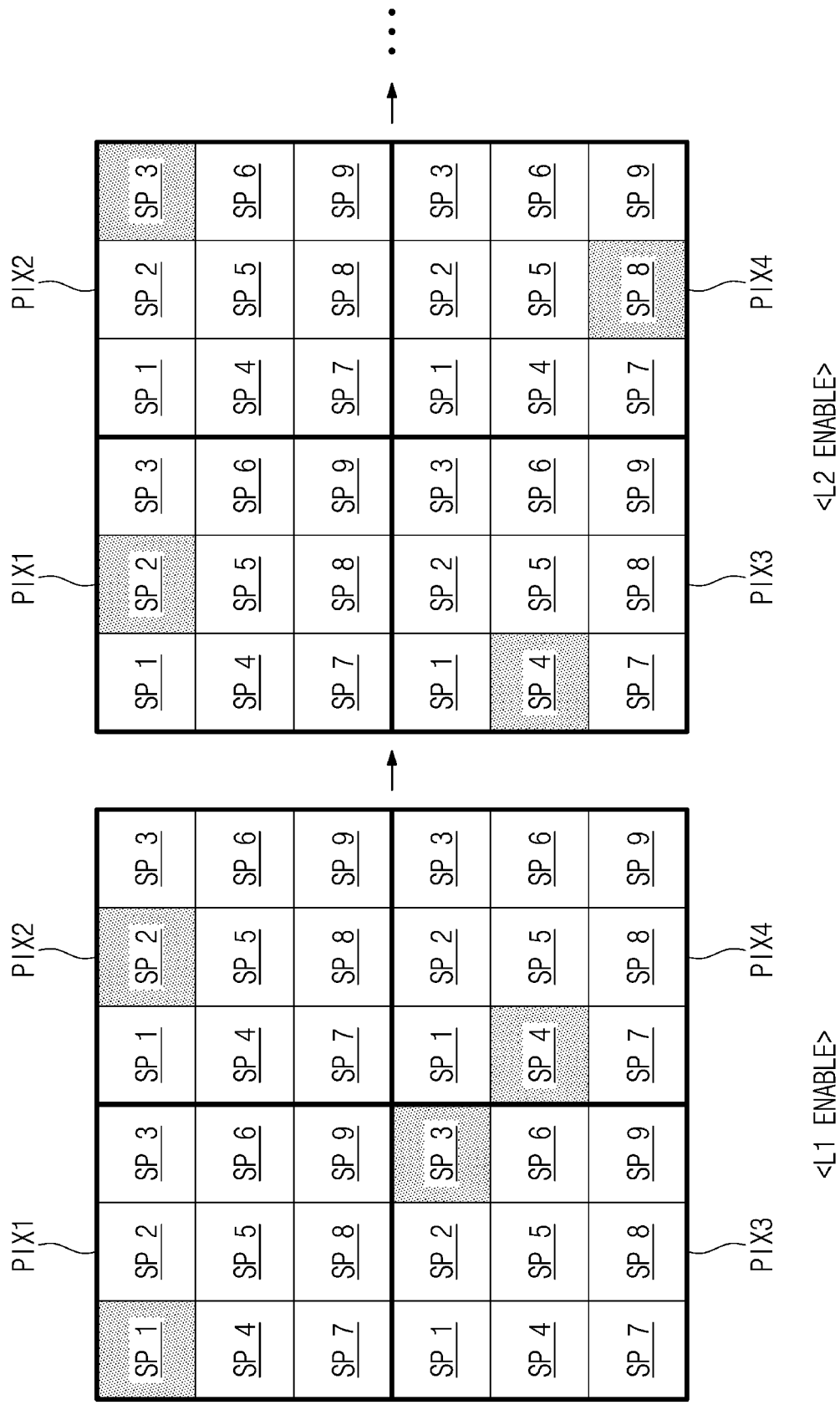
FIG. 15 illustrates a flow in which at least some of sub-pixels are read out based on a wire structure of FIG. 14, according to an example embodiment.

FIG. 15 illustrates a flow in which at least some of the sub-pixels SP1 to SP9 of each of pixels PIX1, PIX2, PIX5, and PIX6 are read out based on a wire structure of FIG. 14, according to an example embodiment. Referring to FIGS. 1, 13, 14, and 15, as described above, the read-out operation may be performed on the pixels PIX1 to PIX2, and the read-out operation may then be performed on the pixels PIX5 to PIX6. In each read-out operation, the signals that are transferred through the metal lines L1 to L9 may be sequentially enabled.

For example, when the signal transferred through the metal line L1 is enabled in each read-out operation, pixel values are respectively detected from the sub-pixel SP1 of the pixel PIX1, the sub-pixel SP2 of the pixel PIX2, the sub-pixel SP3 of the pixel PIX5, and the sub-pixel SP4 of the pixel PIX6. When the signal transferred through the metal line L2 is enabled, pixel values are respectively detected from the sub-pixel SP2 of the pixel PIX1, the sub-pixel SP3 of the pixel PIX2, the sub-pixel SP4 of the pixel PIX5, and the sub-pixel SP8 of the pixel PIX6. Accordingly, in each of the pixels PIX1, PIX2, PIX5, and PIX6, a sub-pixel having a relatively high pixel value is not fixed to any one sub-pixel. As a result, as described above, the noise of the image sensor 100 may be reduced.

In some example embodiments, one pixel may include 16 sub-pixels sharing one floating diffusion node. It may be understood that 16 sub-pixels in one pixel form a 4×4 matrix.

Figure 16:
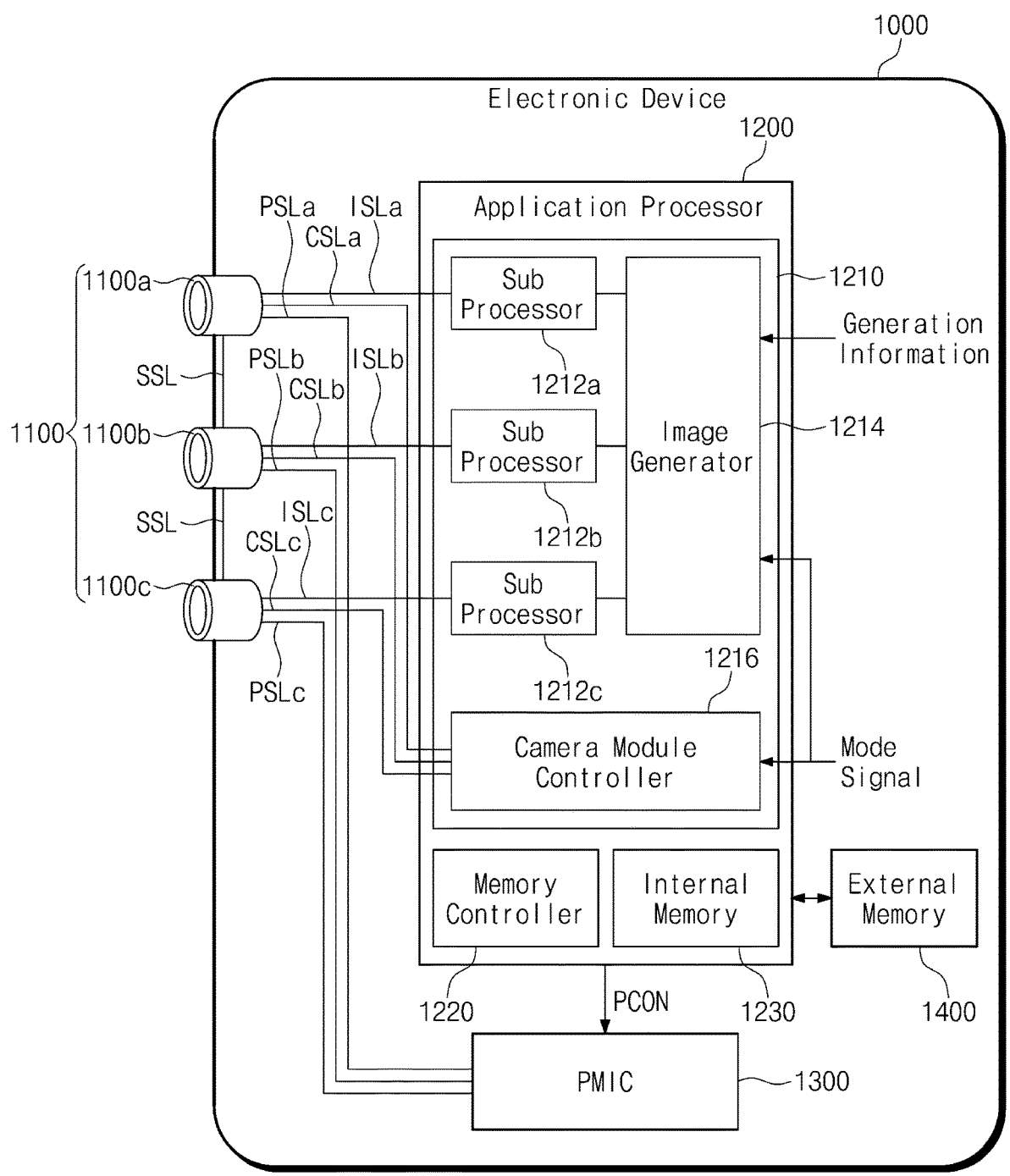
FIG. 16 is a block diagram of an electronic device including a multi-camera module according to some example embodiments.
Figure 17:
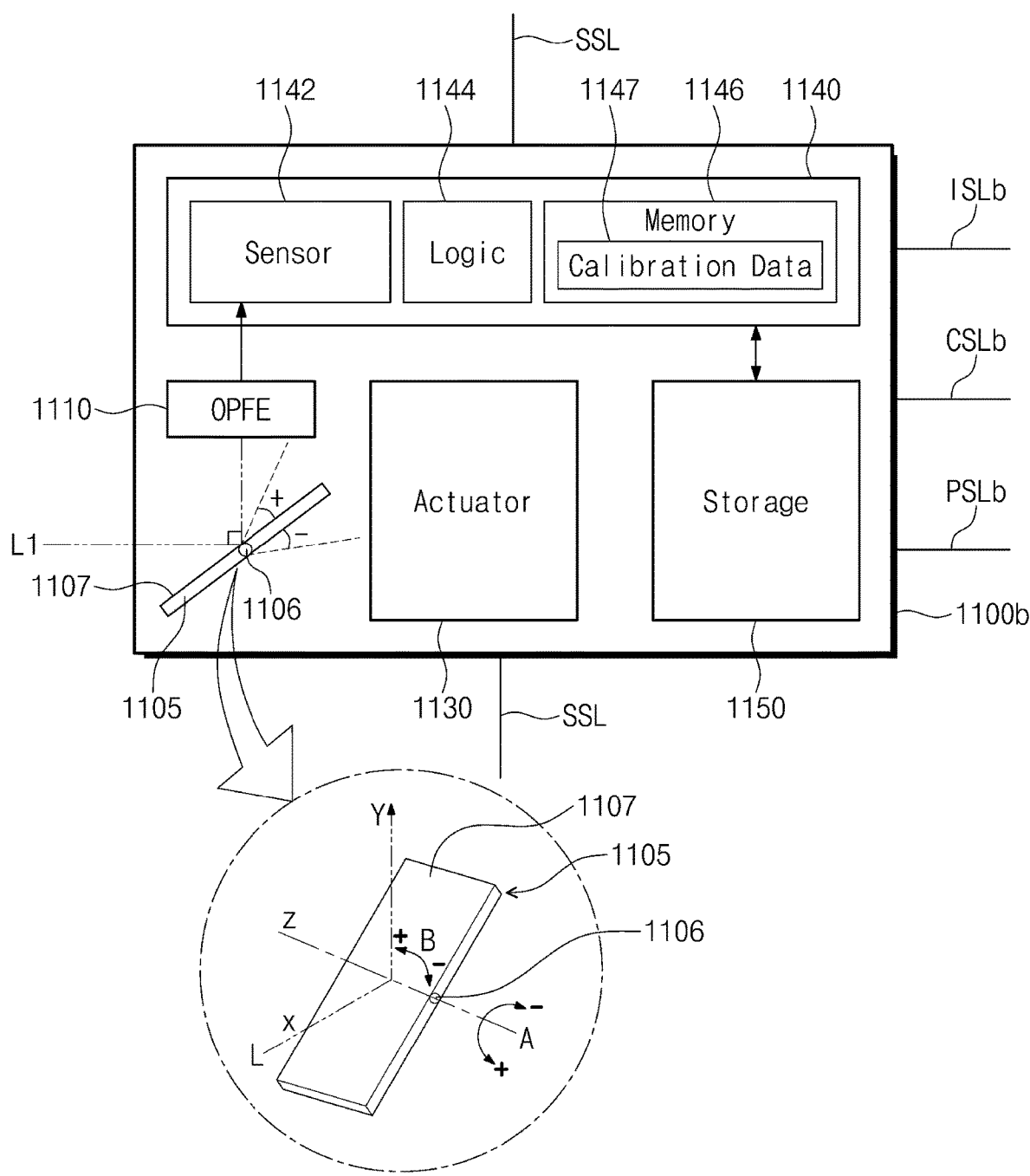
FIG. 17 illustrates a block diagram of a camera module of FIG. 16 in detail, according to some example embodiments.

FIG. 16 is a block diagram of an electronic device including a multi-camera module according to some example embodiments. FIG. 17 is a block diagram illustrating a camera module of FIG. 16 in detail.

Referring to FIG. 16, an electronic device 1000 may include a camera module group 1100, an application processor 1200, a PMIC 1300, and an external memory 1400.

The camera module group 1100 may include a plurality of camera modules 1100a, 1100b, and 1100c. An electronic device including three camera modules 1100a, 1100b, and 1100c is illustrated in FIG. 16, but example embodiments are not limited thereto. In some example embodiments, the camera module group 1100 may be modified to include only two camera modules. Also, in some example embodiments, the camera module group 1100 may be modified to include "i" camera modules (i being a natural number of 4 or more). For example, each of the plurality of camera modules 1100a, 1100b, and 1100c of the camera module group 1100 may include the camera module 1000 of FIG. 1.

Below, a detailed configuration of the camera module 1100b will be more fully described with reference to FIG. 17, but the following description may be equally applied to the remaining camera modules 1100a and 1100c.

Referring to FIG. 17, the camera module 1100b may include a prism 1105, an optical path folding element (OPFE) 1110, an actuator 1130, an image sensing device 1140, and storage 1150.

The prism 1105 may include a reflecting plane 1107 of a light reflecting material and may change a path of a light "L" incident from the outside.

In some example embodiments, the prism 1105 may change a path of the light "L" incident in a first direction (X) to a second direction (Y) perpendicular to the first direction (X), Also, the prism 1105 may change the path of the light "L" incident in the first direction (X) to the second direction (Y) perpendicular to the first (X-axis) direction by rotating the reflecting plane 1107 of the light reflecting material in direction "A" about a central axis 1106 or rotating the central axis 1106 in direction "B". In this case, the OPFE 1110 may move in a third direction (Z) perpendicular to the first direction (X) and the second direction (Y).

In some example embodiments, as illustrated in FIG. 17, a maximum rotation angle of the prism 1105 in direction "A" may be equal to or smaller than 15 degrees in a positive A direction and may be greater than 15 degrees in a negative A direction, but example embodiments are not limited thereto.

In some example embodiments, the prism 1105 may move within approximately 20 degrees in a positive or negative B direction, between 10 degrees and 20 degrees, or between 15 degrees and 20 degrees; here, the prism 1105 may move at the same angle in the positive or negative B direction or may move at a similar angle within approximately 1 degree.

In some example embodiments, the prism 1105 may move the reflecting plane 1107 of the light reflecting material in the third direction (e.g., Z direction) parallel to a direction in which the central axis 1106 extends.

The OPFE 1110 may include optical lenses composed of "j" groups (j being a natural number), for example. Here, one or more of the optical lenses may move in the second direction (Y) to change an optical zoom ratio of the camera module 1100b. For example, when a default optical zoom ratio of the camera module 1100b is "Z", the optical zoom ratio of the camera module 1100b may be changed to an optical zoom ratio of 3Z, 5Z or more by moving one or more of the optical lenses included in the OPFE 1110.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens.

The control logic 1144 may control overall operations of the camera module 1100b. For example, the control logic 1144 may control an operation of the camera module 1100b based on a control signal provided through a control signal line CSLb.

The memory 1146 may store information, which is necessary for an operation of the camera module 1100b, such as calibration data 1147. The calibration data 1147 may include information necessary for the camera module 1100b to generate image data by using the light "L" provided from the outside. The calibration data 1147 may include, for example, information about the degree of rotation described above, information about a focal length, information about an optical axis, etc. In the case where the camera module 1100b is implemented in the form of a multi-state camera in which a focal length varies depending on a location of an optical lens, the calibration data 1147 may include a focal length value for each location (or state) of the optical lens and information about auto focusing.

The storage 1150 may store image data sensed through the image sensor 1142. The storage 1150 may be disposed outside the image sensing device 1140 and may be implemented in a shape where the storage 1150 and a sensor chip constituting the image sensing device 1140 are stacked. In some example embodiments, the storage 1150 may be implemented with an electrically erasable programmable read only memory (EEPROM), but example embodiments are not limited thereto.

Referring together to FIGS. 16 and 17, in some example embodiments, each of the plurality of camera modules 1100a, 1100b, and 1100c may include the actuator 1130. As such, the same calibration data 1147 or different calibration data 1147 may be included in the plurality of camera modules 1100a, 1100b, and 1100c depending on operations of the actuators 1130 therein.

In some example embodiments, one camera module (e.g., 1100b) among the plurality of camera modules 1100a, 1100b, and 1100c may be a folded lens shape of camera module in which the prism 1105 and the OPFE 1110 described above are included, and the remaining camera modules (e.g., 1100a and 1100c) may be a vertical shape of camera module in which the prism 1105 and the OPFE 1110 described above are not included; however, the present disclosure is not limited thereto.

In some example embodiments, one camera module (e.g., 1100c) among the plurality of camera modules 1100a, 1100b, and 1100c may be, for example, a vertical shape of depth camera extracting depth information by using an infrared ray (IR). In this case, the application processor 1200 may merge image data provided from the depth camera and image data provided from any other camera module (e.g., 1100a or 1100b) and may generate a three-dimensional (3D) depth image.

In some example embodiments, at least two camera modules (e.g., 1100a and 1100b) among the plurality of camera modules 1100a, 1100b, and 1100c may have different fields of view. In this case, the at least two camera modules (e.g., 1100a and 1100b) among the plurality of camera modules 1100a, 1100b, and 1100c may include different optical lens, but the present disclosure is not limited thereto.

Also, in some example embodiments, fields of view of the plurality of camera modules 1100a, 1100b, and 1100c may be different. In this case, the plurality of camera modules 1100a, 1100b, and 1100c may include different optical lenses, not example embodiments are not limited thereto.

In some example embodiments, the plurality of camera modules 1100a, 1100b, and 1100c may be disposed to be physically separated from each other. That is, the plurality of camera modules 1100a, 1100b, and 1100c may not use a sensing area of one image sensor 1142, but the plurality of camera modules 1100a, 1100b, and 1100c may include independent image sensors 1142 therein, respectively.

Returning to FIG. 16, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c, the number of which corresponds to the number of the plurality of camera modules 1100a, 1100b, and 1100c.

Image data respectively generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. This image data transmission may be performed, for example, by using a camera serial interface (CSI) based on the MIPI (Mobile Industry Processor Interface), but the present disclosure is not limited thereto.

In some example embodiments, one sub image processor may be disposed to correspond to a plurality of camera modules. For example, the sub image processor 1212a and the sub image processor 1212c may be integrally implemented, not separated from each other as illustrated in FIG. 12; in this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on image generating information Generation Information or a mode signal.

In detail, the image generator 1214 may generate the output image by merging at least a portion of the image data respectively generated from the camera modules 1100a, 1100b, and 1100c having different fields of view, depending on the image generating information Generation Information or the mode signal. Also, the image generator 1214 may generate the output image by selecting one of the image data respectively generated from the camera modules 1100a, 1100b, and 1100c having different fields of view, depending on the image generating information Generation Information or the mode signal.

In some example embodiments, the image generating information Generation Information may include a zoom signal or a zoom factor. Also, in some example embodiments, the mode signal may be, for example, a signal based on a mode selected from a user.

In the case where the image generating information Generation Information is the zoom signal (or zoom factor) and the camera modules 1100a, 1100b, and 1100c have different visual fields of view, the image generator 1214 may perform different operations depending on a kind of the zoom signal. For example, in the case where the zoom signal is a first signal, the image generator 1214 may merge the image data output from the camera module 1100a and the image data output from the camera module 1100c and may generate the output image by using the merged image signal and the image data output from the camera module 1100b that is not used in the merging operation. In the case where the zoom signal is a second signal different from the first signal, without the image data merging operation, the image generator 1214 may select one of the image data respectively output from the camera modules 1100a, 1100b, and 1100c and may output the selected image data as the output image. However, the present disclosure is not limited thereto, and a way to process image data may be modified without limitation if necessary.

In some example embodiments, the image generator 1214 may generate merged image data having an increased dynamic range by receiving a plurality of image data of different exposure times from at least one of the plurality of sub image processors 1212a, 1212b, and 1212c and performing high dynamic range (HDR) processing on the plurality of image data.

The camera module controller 1216 may provide control signals to the camera modules 1100a, 1100b, and 1100c, respectively. The control signals generated from the camera module controller 1216 may be respectively provided to the corresponding camera modules 1100a, 1100b, and 1100c through control signal lines CSLa, CSLb, and CSLc separated from each other.

One of the plurality of camera modules 1100a, 1100b, and 1100c may be designated as a master camera (e.g., 1100b) depending on the image generating information Generation Information including a zoom signal or the mode signal, and the remaining camera modules (e.g., 1100a and 1100c) may be designated as a slave camera. The above designation information may be included in the control signals, and the control signals including the designation information may be respectively provided to the corresponding camera modules 1100a, 1100b, and 1100c through the control signal lines CSLa, CSLb, and CSLc separated from each other.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100a may operate as a master, and the camera module 1100b may operate as a slave.

In some example embodiments, the control signal provided from the camera module controller 1216 to each of the camera modules 1100a, 1100b, and 1100c may include a sync enable signal. For example, in the case where the camera module 1100b is used as a master camera and the camera modules 1100a and 1100c are used as a slave camera, the camera module controller 1216 may transmit the sync enable signal to the camera module 1100b. The camera module 1100b that is provided with sync enable signal may generate a sync signal based on the provided sync enable signal and may provide the generated sync signal to the camera modules 1100a and 1100c through a sync signal line SSL. The camera module 1100b and the camera modules 1100a and 1100c may be synchronized with the sync signal to transmit image data to the application processor 1200.

In some example embodiments, the control signal provided from the camera module controller 1216 to each of the camera modules 1100a, 1100b, and 1100c may include mode information according to the mode signal. Based on the mode information, the plurality of camera modules 1100a, 1100b, and 1100c may operate in a first operating mode and a second operating mode with regard to a sensing speed.

In the first operating mode, the plurality of camera modules 1100a, 1100b, and 1100c may generate image signals at a first speed (e.g., may generate image signals of a first frame rate), may encode the image signals at a second speed (e.g., may encode the image signal of a second frame rate higher than the first frame rate), and transmit the encoded image signals to the application processor 1200. In this case, the second speed may be 30 times or less the first speed.

The application processor 1200 may store the received image signals, that is, the encoded image signals in the internal memory 1230 provided therein or the external memory 1400 placed outside the application processor 1200. Afterwards, the application processor 1200 may read and decode the encoded image signals from the internal memory 1230 or the external memory 1400 and may display image data generated based on the decoded image signals. For example, the corresponding one among sub image processors 1212a, 1212b, and 1212c of the image processing device 1210 may perform decoding and may also perform image processing on the decoded image signal.

In the second operating mode, the plurality of camera modules 1100a, 1100b, and 1100c may generate image signals at a third speed (e.g., may generate image signals of a third frame rate lower than the first frame rate) and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply powers, for example, power supply voltages to the plurality of camera modules 1100a, 1100b, and 1100c, respectively. For example, under control of the application processor 1200, the PMIC 1300 may supply a first power to the camera module 1100a through a power signal line PSLa, may supply a second power to the camera module 1100b through a power signal line PSLb, and may supply a third power to the camera module 1100c through a power signal line PSLc.

Based on a power control signal PCON from the application processor 1200, the PMIC 1300 may generate a power corresponding to each of the plurality of camera modules 1100a, 1100b, and 1100c and may adjust a level of the power. The power control signal PCON may include a power adjustment signal for each operating mode of the plurality of camera modules 1100a, 1100b, and 1100c. For example, the operating mode may include a low-power mode. In this case, the power control signal PCON may include information about a camera module operating in the low-power mode and a set power level. Levels of the powers respectively provided to the plurality of camera modules 1100a, 1100b, and 1100c may be identical to each other or may be different from each other. Also, a level of a power may be dynamically changed.

In the above description, components are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP) block which may include circuitry to perform specific functions, and may have a design that includes a trade secret.

In an image sensor according to an example embodiment, when a read-out operation is performed on each pixel, the order of reading out sub-pixels of each pixel may vary. Accordingly, an offset may be prevented from occurring due to an electron trap of a gate oxide, and a noise of the image sensor may be reduced.

While aspects of example embodiments have been described with reference to the drawings, it will be apparent to those of ordinary skill in the art that various changes and modifications may be made thereto without departing from the spirit and scope of the present disclosure as set forth in the following claims.

What is claimed is:

1. An image sensor comprising:
a pixel array comprising pixels arranged in a row direction and a column direction; and
a plurality of metal lines, the plurality of metal lines comprising a first metal line, a second metal line, a third metal line and a fourth metal line,
wherein a first pixel provided in a first row of the pixel array comprises a first sub-pixel connected with the first metal line, a second sub-pixel connected with the second metal line, a third sub-pixel connected with the third metal line, and a fourth sub-pixel connected with the fourth metal line,
wherein, when a read-out operation is performed on the first pixel, signals applied to the first metal line, the second metal line, the third metal line and the fourth metal line are sequentially enabled,
wherein, based on the signals applied to the first metal line, the second metal line, the third metal line and the fourth metal line, at least a part of charges accumulated in the first sub-pixel, the second sub-pixel, the third sub-pixel and the fourth sub-pixel is diffused to a first floating diffusion node,
wherein the first sub-pixel and the third sub-pixel are adjacent in the column direction, and
wherein the first sub-pixel and the second sub-pixel are adjacent in the row direction.

2. The image sensor of claim 1, wherein the fourth sub-pixel is adjacent to the third sub-pixel in the row direction and is adjacent to the second sub-pixel in the row direction.

3. The image sensor of claim 1, wherein a second pixel provided in the first row comprises a fifth sub-pixel connected with the second metal line, a sixth sub-pixel connected with the first metal line, a seventh sub-pixel connected with the third metal line, and an eighth sub-pixel connected with the fourth metal line,
- wherein the fifth sub-pixel is adjacent to the sixth sub-pixel in the row direction,
- wherein the fifth sub-pixel is adjacent to the seventh sub-pixel in the column direction, and
- wherein the seventh sub-pixel is adjacent to the eighth sub-pixel in the row direction.

4. The image sensor of claim 1, wherein a second pixel provided in the first row comprises a fifth sub-pixel connected with the third metal line, a sixth sub-pixel connected with the second metal line, a seventh sub-pixel connected with the first metal line, and an eighth sub-pixel connected with the fourth metal line,
- wherein the fifth sub-pixel is adjacent to the sixth sub-pixel in the row direction,
- wherein the fifth sub-pixel is adjacent to the seventh sub-pixel in the column direction, and
- wherein the seventh sub-pixel is adjacent to the eighth sub-pixel in the row direction.

5. The image sensor of claim 1, wherein a second pixel provided in the first row comprises a fifth sub-pixel connected with the fourth metal line, a sixth sub-pixel connected with the third metal line, a seventh sub-pixel connected with the second metal line, and an eighth sub-pixel connected with the first metal line,
- wherein the fifth sub-pixel is adjacent to the sixth sub-pixel in the row direction,
- wherein the fifth sub-pixel is adjacent to the seventh sub-pixel in the column direction, and
- wherein the seventh sub-pixel is adjacent to the eighth sub-pixel in the row direction.

6. The image sensor of claim 1, wherein the plurality of metal lines further comprises a fifth metal line, a sixth metal line, a seventh metal line and an eighth metal line,
- wherein a second pixel provided in a second row of the pixel array comprises a fifth sub-pixel connected with the fifth metal line, a sixth sub-pixel connected with the sixth metal line, a seventh sub-pixel connected with the seventh metal line, and an eighth sub-pixel connected with the eighth metal line,
- wherein, when the read-out operation is performed on the second pixel, signals applied to the fifth metal line, the sixth metal line, the seventh metal line and the eighth metal line are sequentially enabled,
- wherein, based on the signals applied to the fifth metal line, the sixth metal line, the seventh metal line and the eighth metal line, at least a part of charges accumulated in the fifth sub-pixel, the sixth sub-pixel, the seventh sub-pixel and the eighth sub-pixel is diffused to a second floating diffusion node,
- wherein the fifth sub-pixel and the sixth sub-pixel are adjacent in the row direction,
- wherein the fifth sub-pixel and the seventh sub-pixel are adjacent in the column direction, and
- wherein the seventh sub-pixel and the eighth sub-pixel are adjacent in the row direction.

7. The image sensor of claim 6, wherein a third pixel provided in the second row comprises a ninth sub-pixel connected with the seventh metal line, a tenth sub-pixel connected with the fifth metal line, an eleventh sub-pixel connected with the sixth metal line, and a twelfth sub-pixel connected with the eighth metal line,
- wherein the ninth sub-pixel is adjacent to the tenth sub-pixel in the row direction,
- wherein the ninth sub-pixel is adjacent to the eleventh sub-pixel in the column direction, and
- wherein the eleventh sub-pixel is adjacent to the twelfth sub-pixel in the row direction.

8. The image sensor of claim 6, wherein a third pixel provided in the second row comprises a ninth sub-pixel connected with the sixth metal line, a tenth sub-pixel connected with the fifth metal line, an eleventh sub-pixel connected with the eighth metal line, and a twelfth sub-pixel connected with the seventh metal line,
- wherein the ninth sub-pixel is adjacent to the tenth sub-pixel in the row direction,
- wherein the ninth sub-pixel is adjacent to the eleventh sub-pixel in the column direction, and
- wherein the eleventh sub-pixel is adjacent to the twelfth sub-pixel in the row direction.

9. The image sensor of claim 6, wherein a third pixel provided in the second row comprises a ninth sub-pixel connected with the fifth metal line, a tenth sub-pixel connected with the sixth metal line, an eleventh sub-pixel connected with the eighth metal line, and a twelfth sub-pixel connected with the seventh metal line,
- wherein the ninth sub-pixel is adjacent to the tenth sub-pixel in the row direction,
- wherein the ninth sub-pixel is adjacent to the eleventh sub-pixel in the column direction, and
- wherein the eleventh sub-pixel is adjacent to the twelfth sub-pixel in the row direction.

10. The image sensor of claim 1, further comprising a color filter provided on the first pixel.

11. The image sensor of claim 1, further comprising:
- a first green color filter provided on the first sub-pixel of the first pixel;
- a second green color filter provided on the third sub-pixel of the first pixel;
- a red color filter provided on the second sub-pixel of the first pixel; and
- a blue color filter provided on the fourth sub-pixel of the first pixel.

12. An image sensor comprising:
- a pixel array comprising pixels arranged in a row direction and a column direction; and
- a plurality of metal lines, the plurality of metal lines comprising a first metal line, a second metal line, a third metal line and a fourth metal line,
- wherein a first pixel provided in a first row of the pixel array comprises a first sub-pixel connected with the first metal line, a second sub-pixel connected with the second metal line, a third sub-pixel connected with the third metal line, and a fourth sub-pixel connected with the fourth metal line,
- wherein a second pixel provided in the first row comprises a fifth sub-pixel connected with the fourth metal line, a sixth sub-pixel connected with the third metal line, a seventh sub-pixel connected with the first metal line, and an eighth sub-pixel connected with the second metal line,
- wherein, when a read-out operation is performed on the first row, signals applied to the first metal line, the second metal line, the third metal line and the fourth metal line are sequentially enabled,
- wherein, based on the signals applied to the first metal line, the second metal line, the third metal line and the fourth metal line, at least a part of charges accumulated in the first sub-pixel, the second sub-pixel, the third sub-pixel and the fourth sub-pixel is diffused to a first floating diffusion node, and at least a part of charges accumulated in the fifth to eighth sub-pixels is diffused to a second floating diffusion node, wherein the first sub-pixel, the second sub-pixel, the fifth sub-pixel, and the sixth sub-pixel are sequentially provided in the row direction, wherein the third sub-pixel, the fourth sub-pixel, the seventh sub-pixel, and the eighth sub-pixel are sequentially provided in the row direction, and wherein the first sub-pixel and the third sub-pixel are adjacent in the column direction.

13. The image sensor of claim 12, wherein the plurality of metal lines further comprises a fifth metal line, a sixth metal line, a seventh metal line and an eighth metal line, wherein a third pixel provided in a second row of the pixel array comprises a ninth sub-pixel connected with the fifth metal line, a tenth sub-pixel connected with the sixth metal line, an eleventh sub-pixel connected with the seventh metal line, and a twelfth sub-pixel connected with the eighth metal line, wherein, when the read-out operation is performed on the second row, signals applied to the fifth metal line, the sixth metal line, the seventh metal line and the eighth metal line are sequentially enabled, wherein, based on the signals applied to the fifth metal line, the sixth metal line, the seventh metal line and the eighth metal line, at least a part of charges accumulated in the fifth sub-pixel, the sixth sub-pixel, the seventh sub-pixel and the eighth sub-pixel is diffused to a third floating diffusion node, wherein the tenth sub-pixel and the ninth sub-pixel are sequentially provided in the row direction, wherein the twelfth sub-pixel and the eleventh sub-pixel are sequentially provided in the row direction, wherein the ninth sub-pixel and the eleventh sub-pixel are sequentially provided in the column direction.

14. The image sensor of claim 12, wherein the plurality of metal lines further comprises a fifth metal line, a sixth metal line, a seventh metal line and an eighth metal line, wherein a third pixel provided in a second row of the pixel array comprises a ninth sub-pixel connected with the fifth metal line, a tenth sub-pixel connected with the sixth metal line, an eleventh sub-pixel connected with the seventh metal line, and a twelfth sub-pixel connected with the eighth metal line, wherein, when the read-out operation is performed on the second row, signals applied to the fifth metal line, the sixth metal line, the seventh metal line and the eighth metal line are sequentially enabled, wherein, based on the signals applied to the fifth metal line, the sixth metal line, the seventh metal line and the eighth metal line, at least a part of charges accumulated in the fifth sub-pixel, the sixth sub-pixel, the seventh sub-pixel and the eighth sub-pixel is diffused to a third floating diffusion node, wherein the tenth sub-pixel and the ninth sub-pixel are sequentially provided in the row direction, wherein the twelfth sub-pixel and the eleventh sub-pixel are sequentially provided in the row direction, and wherein the ninth sub-pixel and the eleventh sub-pixel are sequentially provided in the column direction.

15. The image sensor of claim 12, further comprising:
a first color filter provided on the first pixel; and
a second color filter provided on the second pixel.

16. The image sensor of claim 12, further comprising:
a first green color filter provided on the first sub-pixel of the first pixel;
a second green color filter provided on the third sub-pixel of the first pixel,
a red color filter provided on the second sub-pixel of the first pixel; and
a blue color filter provided on the fourth sub-pixel of the first pixel.

17. An image sensor comprising:
a pixel array comprising pixels arranged in a row direction and a column direction; and
a plurality of metal lines, the plurality of metal lines comprising a first metal line, a second metal line, a third metal line, a fourth metal line, a fifth metal line, a sixth metal line, a seventh metal line, an eighth metal line and a ninth metal line, wherein a first pixel provided in a first row of the pixel array comprises a first sub-pixel connected with the first metal line, a second sub-pixel connected with the second metal line, a third sub-pixel connected with the third metal line, a fourth sub-pixel connected with the fourth metal line, a fifth sub-pixel connected with the fifth metal line, a sixth sub-pixel connected with the sixth metal line, a seventh sub-pixel connected with the seventh metal line, an eighth sub-pixel connected with the eighth metal line, and a ninth sub-pixel connected with the ninth metal line, wherein a second pixel provided in the first row comprises a tenth sub-pixel, an eleventh sub-pixel connected with the first metal line and a twelfth sub-pixel connected with the second metal line, wherein, when a read-out operation is performed on the first pixel, signals applied to the first metal line, the second metal line, the third metal line, the fourth metal line, the fifth metal line, the sixth metal line, the seventh metal line, the eighth metal line and the ninth metal line are sequentially enabled, wherein, based on the signals applied to the first metal line, the second metal line, the third metal line, the fourth metal line, the fifth metal line, the sixth metal line, the seventh metal line, the eighth metal line and the ninth metal line, at least a part of charges accumulated in the first sub-pixel, the second sub-pixel, the third sub-pixel, the fourth sub-pixel, the fifth sub-pixel, the sixth sub-pixel, the seventh sub-pixel, the eighth sub-pixel and the ninth sub-pixel is diffused to a first floating diffusion node, and wherein the first sub-pixel, the second sub-pixel, the third sub-pixel, the tenth sub-pixel, the eleventh sub-pixel and the twelfth sub-pixel are sequentially provided in the row direction.

18. The image sensor of claim 17, wherein the plurality of metal lines further comprises a tenth metal line, an eleventh metal line and a twelfth metal line, wherein a third pixel provided in a second row of the pixel array comprises a thirteenth sub-pixel connected with the tenth metal line, a fourteenth sub-pixel connected with an eleventh metal line, and a fifteenth sub-pixel connected with a twelfth metal line, wherein, when the read-out operation is performed on the third pixel, a signal applied to the eleventh metal line is enabled after a signal applied to the tenth metal line, wherein, based on the signals applied to the tenth metal line, the eleventh metal line and the twelfth metal line, at least a part of charges accumulated in the thirteenth sub-pixel, the fourteenth sub-pixel and the fifteenth sub-pixel is diffused to a second floating diffusion node, wherein the ninth sub-pixel of the first pixel and the twelfth sub-pixel of the third pixel are sequentially provided in the column direction, and wherein the seventh sub-pixel of the first pixel and the thirteenth sub-pixel of the third pixel are sequentially provided in the column direction.

19. The image sensor of claim 17, wherein the plurality of metal lines further comprises a tenth metal line and an eleventh metal line, wherein a third pixel provided in a second row of the pixel array comprises a thirteenth sub-pixel connected with a tenth metal line and a fourteenth sub-pixel connected with an eleventh metal line, wherein, when the read-out operation is performed on the third pixel, a signal applied to the eleventh metal line is enabled after a signal applied to the tenth metal line, wherein, based on the signals applied to the tenth metal line and the eleventh metal line, at least a part of charges accumulated in the thirteenth sub-pixel and the fourteenth sub-pixel is diffused to a second floating diffusion node, wherein the thirteenth sub-pixel is provided in a first row of the third pixel, and wherein the fourteenth sub-pixel is provided in a second row of the third pixel.

20. The image sensor of claim 17, further comprising:
a first color filter provided on the first pixel; and
a second color filter provided on the second pixel.

* * * * *